United States Patent
Neema et al.

(10) Patent No.: US 12,028,085 B2
(45) Date of Patent: Jul. 2, 2024

(54) DIGITAL-TO-ANALOG CONVERTER WITH DIGITALLY CONTROLLED TRIM

(71) Applicant: Texas Instruments Incorporated, Dallas, TX (US)

(72) Inventors: Tanmay Neema, Bangalore (IN); Gautam Salil Nandi, Bangalore (IN); Rishubh Khurana, Bangalore (IN); Atul Kumar Agrawal, Bangalore (IN); Deepak Kumar Meher, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 43 days.

(21) Appl. No.: 17/586,155

(22) Filed: Jan. 27, 2022

(65) Prior Publication Data

US 2023/0238972 A1   Jul. 27, 2023

(51) Int. Cl.
| H03M 1/06 | (2006.01) |
| H03M 1/10 | (2006.01) |
| H03M 1/66 | (2006.01) |
| H03M 1/68 | (2006.01) |
| H03M 1/78 | (2006.01) |
| H03M 1/80 | (2006.01) |

(52) U.S. Cl.
CPC ....... *H03M 1/0604* (2013.01); *H03M 1/1057* (2013.01); *H03M 1/687* (2013.01); *H03M 1/785* (2013.01); *H03M 1/808* (2013.01); *H03M 1/66* (2013.01)

(58) Field of Classification Search
CPC ...... H03M 1/0604; H03M 1/66; H03M 1/687; H03M 1/785; H03M 1/1057; H03M 1/808
USPC ......................................... 341/118, 144–145
See application file for complete search history.

(56) References Cited

U.S. PATENT DOCUMENTS

| 5,969,658 A * | 10/1999 | Naylor ..................... H03M 1/68 |
| | | 341/145 |
| 8,013,772 B2 * | 9/2011 | Li .......................... H03M 1/785 |
| | | 341/154 |
| 9,276,598 B1 * | 3/2016 | Li ....................... H03M 1/1057 |

* cited by examiner

*Primary Examiner* — Khai M Nguyen
(74) *Attorney, Agent, or Firm* — John R. Pessetto; Frank D. Cimino

(57) ABSTRACT

In described examples, a digital-to-analog converter includes an output, multiple most significant bit (MSB) connector resistors each having a resistance R−ΔR, multiple least significant bit (LSB) connector resistors each having a resistance R, and multiple binary arm resistors each having a resistance 2R. The MSB connector resistors are coupled in a series beginning with the output and ending with a first one of the LSB connector resistors, and the LSB connector resistors are coupled in a series beginning with the first LSB connector resistor. A terminal of one of the binary arm resistors is coupled to an ending of the LSB connector resistor series, and a terminal of each of different remaining ones of the binary arm resistors is coupled between a different pair of the MSB and/or LSB connector resistors.

15 Claims, 12 Drawing Sheets

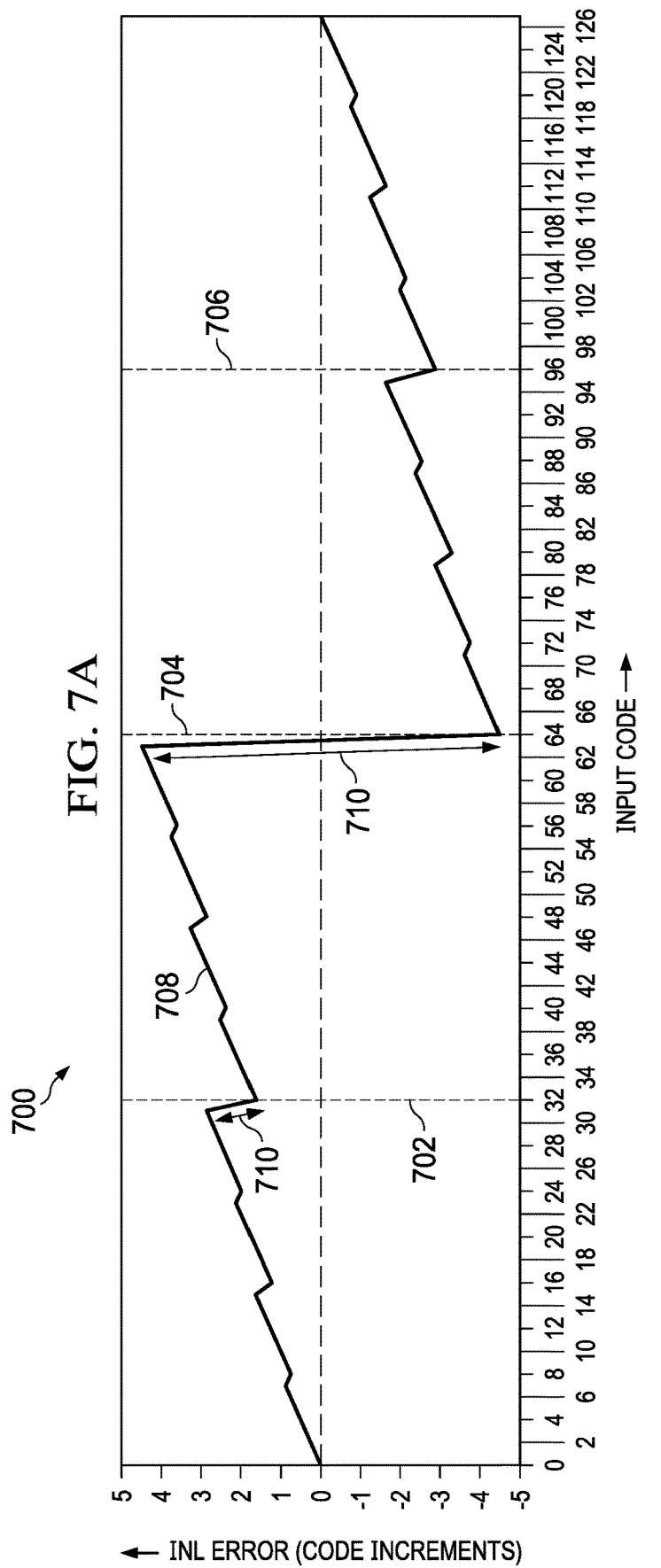

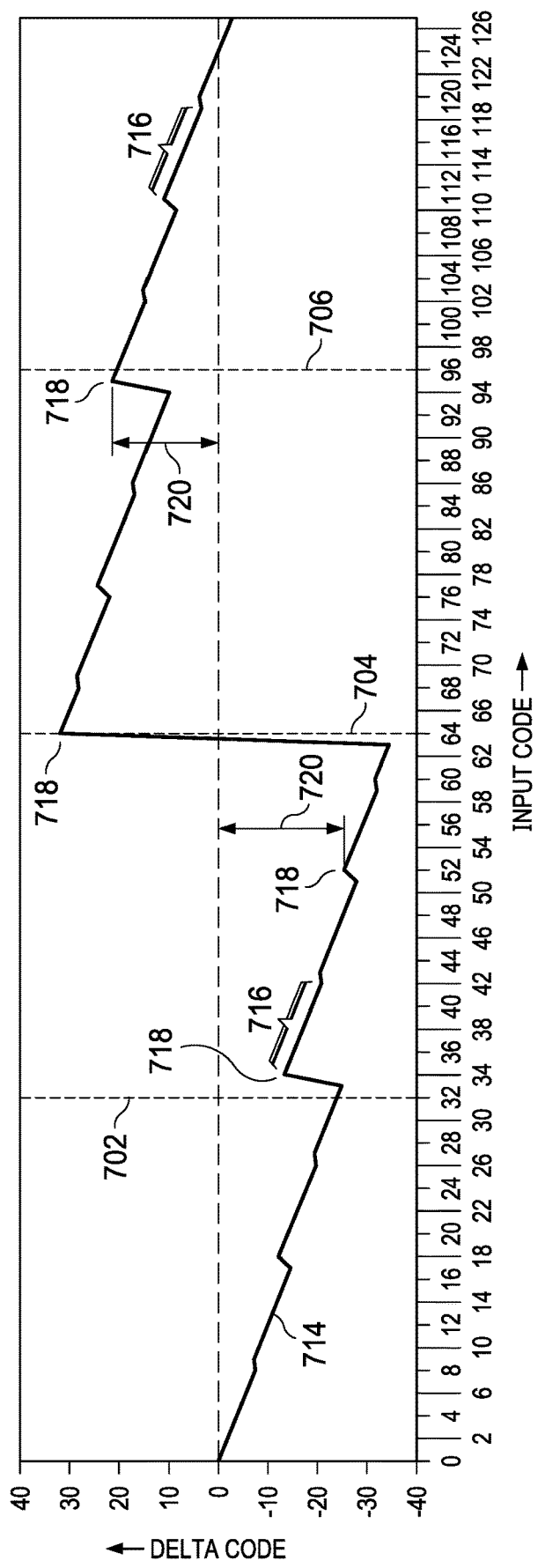

DIGITAL-TO-ANALOG CONVERTER WITH DIGITALLY CONTROLLED TRIM

TECHNICAL FIELD

This application relates generally to digital-to-analog converters, and more particularly to digital-to-analog converters with digitally controlled trim.

BACKGROUND

A digital-to-analog converter ("DAC") is a device or configuration that receives a digital input and provides an output voltage proportional to the value of the digital input, or code. The digital value may follow, for example, standard binary representation. There are various DAC architectures currently used in available devices. Selection of a particular architecture may depend on the application and performance and design metrics, such as power consumption, speed, glitch magnitude and energy, the area required to implement the device, and so forth.

DAC performance may depend on error, such as differential nonlinearity (DNL) and integral nonlinearity (INL), introduced or propagated by the DAC. DNL error is the difference between the magnitude of the ideal output voltage step between successive codes, which should correspond to a least significant bit change in the code and the magnitude of the measured voltage step between successive codes. INL error is the difference between the ideal output voltage for a particular code and the measured output voltage for the code.

SUMMARY

In described examples, a digital-to-analog converter includes an output, multiple most significant bit (MSB) connector resistors each having a resistance R−ΔR, multiple least significant bit (LSB) connector resistors each having a resistance R, and multiple binary arm resistors each having a resistance 2R. The MSB connector resistors are coupled in a series beginning with the output and ending with a first one of the LSB connector resistors, and the LSB connector resistors are coupled in a series beginning with the first LSB connector resistor. A terminal of one of the binary arm resistors is coupled to an ending of the LSB connector resistor series, and a terminal of each of different remaining ones of the binary arm resistors is coupled between a different pair of the MSB and/or LSB connector resistors.

In some described examples, a DAC includes an output terminal; multiple most significant bit (MSB) connector resistors each having a first resistance and each including a first MSB connector terminal and a second MSB connector terminal; multiple least significant bit (LSB) connector resistors each having a second resistance different than the first resistance, and each of the multiple LSB connector resistors including a first LSB connector terminal and a second LSB connector terminal; and multiple binary arm resistors each having a third resistance different than the first resistance and the second resistance, each of the multiple binary arm resistors including a first binary terminal and a second binary terminal; wherein the MSB connector resistors are coupled in series and the LSB connector resistors are coupled in series, so that a first one of the first MSB connector terminals is coupled to the output terminal, a last one of the second MSB connector terminals is coupled to a first one of the first LSB connector terminals, other second MSB connector terminals are coupled to first MSB connector terminals of next-in-the-series ones of the MSB connector resistors, and other second LSB connector terminals are coupled to first LSB connector terminals of next-in-the-series ones of the LSB connector resistors; and wherein each of the first binary terminals is coupled to a different one of the second MSB connector terminals or the second LSB connector terminals.

In some described examples, the first resistance is R-ΔR, the second resistance is R, and the third resistance is 2R.

In some described examples, the DAC includes multiple thermometric arm resistors each having the third resistance and each including a first thermometric terminal and a second thermometric terminal, the first thermometric terminals coupled to the output terminal.

In some described examples, the DAC includes a first reference voltage node adapted to receive a first reference voltage; a second reference voltage node adapted to receive a second reference voltage; multiple arm switches, different ones of the arm switches coupled to different corresponding ones of the second binary terminals to couple the corresponding second binary terminal to the first reference voltage node when the corresponding arm switch is activated, and to couple the corresponding second binary terminal to the second reference voltage node when the corresponding arm switch is deactivated; and a controller configured to receive an input code corresponding to a first ideal output voltage of the R2R DAC, to generate an output code that corresponds to a second ideal output voltage of the R2R DAC different from the first ideal output voltage, and to control the arm switches using the output code.

In some described examples, a difference between the first resistance and the second resistance is selected to cause activations of ones of the switches coupled via corresponding binary arm resistors to second MSB connector terminals to contribute negative differential nonlinearity (DNL) errors to an output voltage of the DAC.

In some described examples, the DAC includes a clock configured to generate a clock signal; and a controller configured to receive an input code serially, so that one bit of the input code is received per cycle of the clock signal, the controller configured to cause the DAC to output a trimmed output voltage on a cycle of the clock signal during which the controller receives a last bit of the input code.

In some described examples, the DAC includes a memory; and a controller configured to: receive an input code; control the DAC to generate an output voltage using the input code; facilitate determining differential nonlinearity (DNL) error contributions corresponding to each of the binary arm resistors coupled to ones of the second MSB connector terminals; and store the determined DNL error contributions in the memory.

In some described examples, a difference between the first resistance and the second resistance is different for different ones of the MSB binary connector resistors.

In some described examples, the DAC includes a reference voltage node; multiple trim connector resistors having the second resistance and including a first trim connector terminal and a second trim connector terminal; and multiple trim arm resistors having the third resistance and including a first trim arm terminal and a second trim arm terminal; wherein the trim connector resistors are coupled in series between the last LSB connector resistor and the reference voltage node, so that the first trim connector terminal of a first one of the trim connector resistors is coupled to the second LSB connector terminal of the last LSB connector resistor, the second trim connector terminal of a last one of the trim connector resistors is coupled to the reference voltage node, and other second trim connector terminals are coupled to first connector terminals of next-in-the-series ones of the trim connector resistors; and wherein the first trim arm terminal of different ones of the trim arm resistors is coupled to the second trim connector terminal of different ones of the trim connector resistors.

In some described examples, a DAC includes a first reference voltage node adapted to receive a first reference voltage; a second reference voltage node adapted to receive a second reference voltage; an output node; multiple switches; multiple first resistors including an output end and a terminus end and having a first resistance; multiple second resistors including an output end and a terminus end and having a second resistance less than the first resistance; multiple third resistors having a third resistance greater than the first resistance; multiple most significant bit (MSB) arms, each of the MSB arms including one of the third resistors and coupled to the terminus end of a different one of the second resistors; and multiple least significant bit (LSB) arms, each of the LSB arms including one of the third resistors and coupled to the terminus end of a different one of the first resistors; wherein the first resistors are coupled in a first series and the second resistors are coupled in a second series, so that an output end of a second resistor at a first end of the first series is coupled to the output node and a terminus end of a second resistor at a second end of the first series is coupled to an output end of a first resistor at a first end of the second series, ones of the LSB arms and MSB arms configured to be coupled to the first reference voltage node after corresponding ones of the switches are activated and to be coupled to the second reference voltage node after the corresponding ones of the switches are deactivated, so that an output voltage is generated at the output node if one or more of the switches is activated.

In some described examples, the first resistance is R, the second resistance is R-ΔR, and the third resistance is 2R.

In some described examples, a magnitude of the output voltage is responsive to a bit-significance of ones of the LSB arms or MSB arms corresponding to activated ones of the switches.

In some described examples, the DAC includes a controller that includes a code input adapted to receive a control code, the controller configured to activate and deactivate the switches in response to the control code, the control code corresponding to a first ideal output voltage of the DAC, the controller configured to generate an output code that corresponds to a second ideal output voltage of the R2R DAC different from the first ideal output voltage, and to control the switches using the output code.

In some described examples, the DAC includes multiple thermometric arm resistors each having the third resistance and each coupled to the output node.

In some described examples, a difference between the first resistance and the second resistance is selected to cause activations of ones of the switches coupled via corresponding ones of the third resistors to the terminus end of a corresponding one of the second resistors to contribute negative differential nonlinearity (DNL) errors to the output voltage.

In some described examples, the DAC includes a clock configured to generate a clock signal; and a controller configured to receive an input code serially, so that one bit of the input code is received per cycle of the clock signal, the controller configured to cause the DAC to output a trimmed output voltage on a cycle of the clock signal during which the controller receives a last bit of the input code.

In some described examples, the DAC includes a memory; and a controller configured to: receive an input code; control the DAC to generate an output voltage using the input code; facilitate determining differential nonlinearity (DNL) error contributions corresponding to each of the third resistors coupled to a corresponding terminus end of a second resistor; and store the determined DNL error contributions in the memory.

In some described examples, a DAC on an integrated circuit includes a first reference voltage node adapted to receive a first reference voltage; a second reference voltage node adapted to receive a second reference voltage; an output node; multiple switches; multiple first resistors including an output end and a terminus end and having a first resistance; multiple second resistors including an output end and a terminus end and having a second resistance; multiple third resistors having a third resistance that is twice the first resistance; and multiple most significant bit (MSB) arms and multiple least significant bit (LSB) arms, each of the MSB arms including a third resistor and coupled to the terminus end of a different one of the second resistors, and each of the LSB arms including a third resistor and coupled to the terminus end of a different one of the first resistors, the first resistors coupled in a first series and the second resistors coupled in a second series, so that an output end of a second resistor at a first end of the first series is coupled to the output node and a terminus end of a second resistor at a second end of the first series is coupled to an output end of a first resistor at a first end of the second series, ones of the LSB and MSB arms configured to be coupled to the first reference voltage node after corresponding ones of the switches are activated and to be coupled to the second reference voltage node after the corresponding ones of the switches are deactivated, so that an output voltage is generated at the output node if one or more of the switches is activated; wherein the second resistance is selected so that activating ones of the switches corresponding to ones of the MSB arms contributes a negative differential nonlinearity (DNL) error to the output voltage.

In some described examples, a magnitude of the output voltage is responsive to a bit-significance of ones of the LSB arms or MSB arms corresponding to activated ones of the switches.

In some described examples, the DAC includes a controller that includes a code input adapted to receive a control code, the controller configured to activate and deactivate the switches in response to the control code, the control code corresponding to a first ideal output voltage of the DAC, the controller configured to generate an output code that corresponds to a second ideal output voltage of the R2R DAC different from the first ideal output voltage, and to control the switches using the output code.

In some described examples, the DAC includes multiple thermometric arm resistors each having the third resistance and each coupled to the output node.

In some described examples, the DAC includes a clock configured to generate a clock signal; and a controller configured to receive an input code serially, so that one bit of the input code is received per cycle of the clock signal, the controller configured to cause the DAC to output a trimmed output voltage on a cycle of the clock signal during which the controller receives a last bit of the input code.

In some described examples, the DAC includes a memory; and a controller configured to: receive an input code; control the DAC to generate an output voltage using the input code; facilitate determining differential nonlinearity (DNL) errors corresponding to each of the binary arm resistors coupled to ones of the second MSB connector terminals; and store the determined DNL errors in the memory.

BRIEF DESCRIPTION OF THE DRAWINGS

FIG. 7A shows a graph of an example of input code $C_A$ versus untrimmed INL error for the R2R DAC of FIG. 1.

FIG. 7B shows a graph of an example of input code $C_A$ versus delta code for the R2R DAC of FIG. 1.

Figure 1:
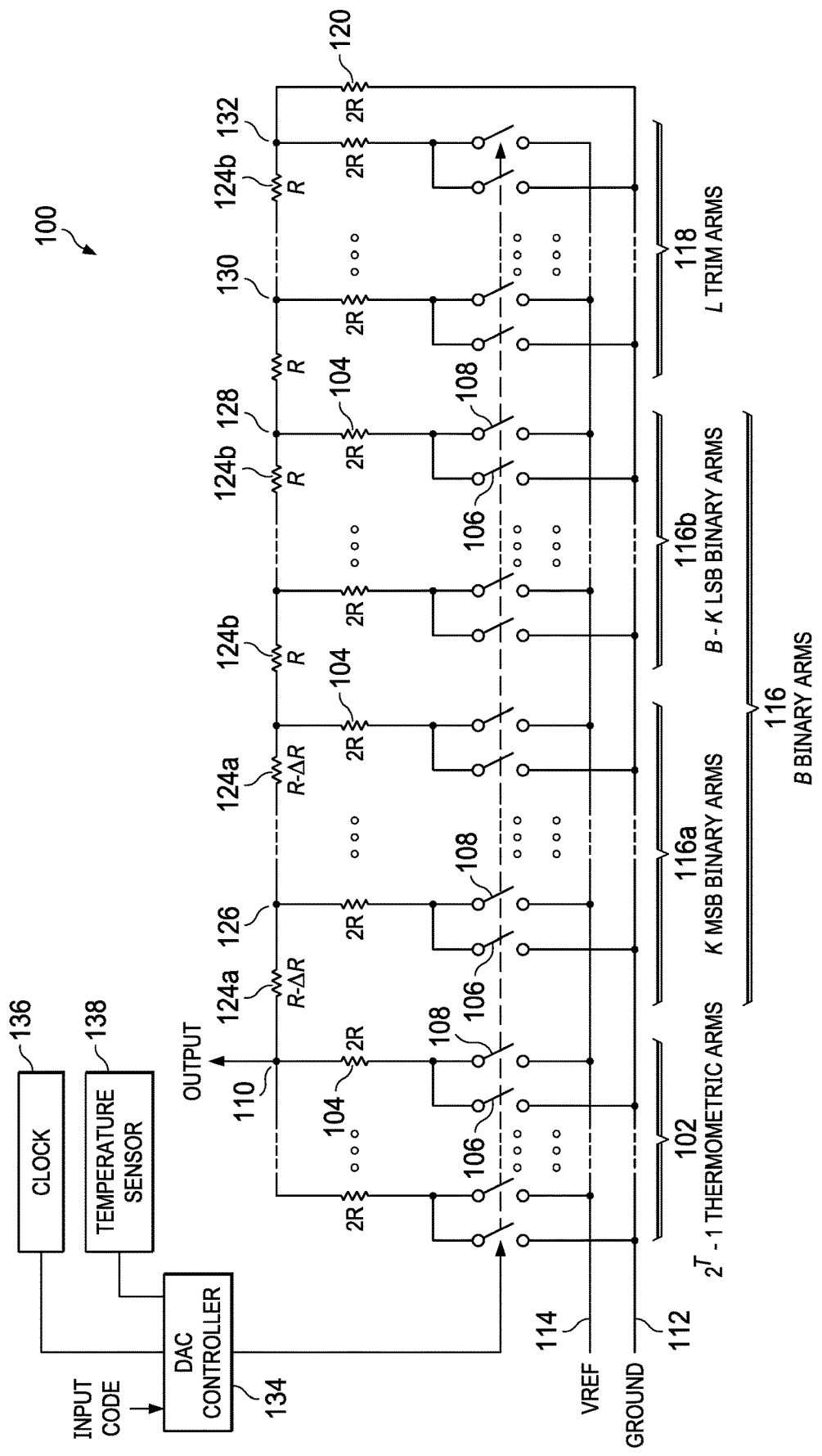
FIG. 1 shows an example circuit diagram of a segmented R2R DAC 100.

The same reference numbers or other reference designators are used in the drawings to designate the same or similar (structurally and/or functionally) features. The base number (e.g. an integer) is used herein to designate each/all variants of the reference number. For example, the reference number 116 may be used to designate one or more variants of 116, such as 116a, 116b, etc.

DETAILED DESCRIPTION

R2R DAC With Digitally Controlled Trim

FIG. 1 shows an example circuit diagram of a segmented R2R DAC 100. The R2R DAC 100 (also referred to as an R2R or R-2R resistor ladder DAC) has an integer N bit resolution, which means the R2R DAC 100 is operable to convert an N bit input code to an output analog voltage. R2R DAC 100 has $2^T-1$ thermometric arms 102 (also called thermometer arms), where T is any integer. Each thermometric arm 102 includes an arm resistor 104, a ground switch 106, and a VREF switch 108. Each arm resistor 104 has resistance 2R (for a unit resistance value R), and includes a first terminal connected to an output terminal 110 of the R2R DAC 100, and a second terminal connected to a pole of the corresponding ground switch 106 and a pole of the corresponding VREF switch 108. A throw terminal of the ground switch 106 is connected to a ground 112, and a throw terminal of the VREF switch 108 is connected to a voltage reference VREF 114. Accordingly, a given thermometric arm 102 can be "activated", in response to the DAC input code, by selectively switching closed (e.g. to cause the switch to be conducting) its VREF switch 108 so that the 2R resistance of an arm resistor 104 from the given thermometric arm 102 may be switched into the total resistance coupled between VREF and the output terminal 110, thereby affecting the total output voltage of the R2R DAC 100. Alternatively, any thermometric arm 102 may be "deactivated" by selectively closing its ground switch 106, effectively excluding the 2R resistance of the deactivated thermometric arm 102 from the total resistance between VREF and the output terminal 110. As detailed later, the selective activation or deactivation of a thermometric arm 102 provides a relatively coarse selection of analog output voltage in response the DAC input code. (Switches 106 and 108 can also be implemented as a single switch that pivots between VREF and ground 112.)

The R2R DAC 100 has B binary R2R arms 116 (where B is any integer), so that the number T from the $2^T-1$ thermometric arms 102 plus the number B of binary arms 116 equals the N-bit resolution of the R2R DAC 100 (T+B=N). As detailed later, the selective activation or deactivation of a binary arm 116 provides a relatively fine selection of analog output voltage in response the DAC input code. The R2R DAC 100 also has L trim arms 118 (where L is any integer) as well as a termination resistor 120.

Each binary arm 116 and each trim arm 118 respectively includes an arm resistor 104, a ground switch 106, and a VREF switch 108. Each binary arm 116 and each trim arm 118 also respectively corresponds to a connector resistor 124; that is, each binary arm 116 and each trim arm 118 is connected to a different connector resistor 124 so that the respective connector resistor 124 is the nearest connector resistor 124 to the binary arm 116 or trim arm 118 that is connected between the binary arm 116 or trim arm 118 and the output terminal 110. The connector resistors are divided into connector resistors 124a and 124b, as further explained below. Each arm resistor 104 has resistance 2R, and includes a first terminal and a second terminal connected to a pole of the corresponding ground switch 106 and a pole of the corresponding VREF switch 108. A throw terminal of the ground switch 106 is connected to ground 112, and a throw terminal of the VREF switch 108 is connected to VREF 114. Accordingly, a given binary arm 116 can be activated by selectively switching closed its VREF switch 108 so that the 2R resistance of an arm resistor 104 from the given binary arm 116 may be switched into the total resistance coupled between VREF and the output terminal 110, thereby affecting the total output voltage of the R2R DAC 100. Alternatively, any binary arm 116 may be deactivated by selectively closing its ground switch 106, effectively excluding the 2R resistance of the deactivated binary arm 116 from the total resistance between VREF and the output terminal 110.

Each connector resistor 124a or 124b has a first terminal and a second terminal. Each of the K most significant bit (MSB) binary arms 116a has a corresponding connector resistor 124a, which has a resistance of (R−ΔR). The value of ΔR is a resistance value selected in response to fabrication process tolerances to force DNL error contributions of the K MSB binary arms 116a to be negative. This also causes the DNL error contributions of the thermometric arms 102 to be negative (further discussed below with respect to FIGS. 2B, 2C, 3, and 4). In some examples, ΔR is chosen to add a negative DNL error that is greater than a maximum DNL error of the R2R DAC 100 caused by resistance mismatch of the connector resistors 124 due to process, voltage, and temperature (and other) variation. K is selected as the number of MSB binary arms 116*a* that require trimming for their respective DNL errors according to some or all of design, manufacturing process tolerances, performance requirements, specified operating conditions, and test of the R2R DAC 100. In some examples, the B–K least significant bit (LSB) binary arms 116*b* contribute DNL errors that can be considered negligible. For the B–K LSB binary arms 116*b*, each has a corresponding connector resistor 124*b*, and the resistance of the corresponding connector resistor 124*b* (LSB connector resistors 124*b*) is R.

In an MSB arm 126 of the K MSB binary arms 116*a* (the binary arm 116 with the most significance among the K MSB binary arms 116*a*), the first terminal of its MSB connector resistor 124*a* is connected to the output terminal 110. In an LSB arm 128 of the LSB binary arms 116*b* (the binary arm 116 with the least significance among the B–K LSB binary arms 116*b*), a second terminal of its connector resistor 124*b* is connected to the first terminal of the arm resistor 104 of the LSB arm 128 of the LSB binary arms 116*b*, and to the first terminal of the connector resistor 124*b* corresponding to an MSB arm 130 of the trim arms 118. (The trim arms 118 of the R2R DAC 100 can be thought of as LSB extensions of the binary arms 116, as further discussed with respect to FIG. 2A. Accordingly, connector resistors 124*b* corresponding to the trim arms 118 are referred to herein as LSB connector resistors 124*b*.) Each of the other second terminals of the connector resistors 124 corresponding to the binary arms 116 (each of which corresponds to a binary arm 116 with a different bit significance) is connected to the first terminal of the arm resistor 104 of a corresponding binary arm of the binary arms 116, and to the first terminal of the connector resistor 124 corresponding to the next-most-significant bit (significance minus one) binary arm of the binary arms 116.

In a least significance trim arm 132 of the trim arms 118, the second terminal of the connector resistor 124*b* corresponding to that trim arm 118 is connected to the first terminal of the arm resistor 104 corresponding to that trim arm 118, and to a first terminal of the termination resistor 120. Each of the other second terminals of the connector resistors 124*b* corresponding to respective trim arms 118 (each of which corresponds to a trim arm 118 with a different bit significance) is connected to the first terminal of the connector resistor 124*b* corresponding to the next-most-significant bit trim arm of the trim arms 118.

The termination resistor 120 has a first terminal, a second terminal, and a resistance value 2R. The second terminal of the termination resistor is connected to ground 112.

A DAC controller 134 is connected to control each of the ground switches 106 and each of the VREF switches 108. A clock 136 is connected to clock the DAC controller 134. The DAC controller 134 can be, for example, a processor, a state machine, memory, digital circuitry and/or any dedicated control circuit. A temperature sensor 138 may also be connected to and provide sensed temperature data to the DAC controller 134 (function of the temperature sensor is further described with respect to FIG. 2A). The DAC controller 134 receives an input code corresponding to an intended output voltage of the R2R DAC 100. The DAC controller 134 generates an output code using the input code and information regarding DNL error of the R2R DAC 100, and, in response, the DAC controller 134 uses the output code to control the ground switches 106 and VREF switches 108 to cause the R2R DAC 100 to generate the intended output voltage. The output code, and generation of the output code, are further described below with respect to FIGS. 2A and 2B and Equations 1 and 2.

For a given input code $C_A$, the ideal output voltage is $$V_{out} = V_{ref} \times \frac{C_A}{2^N}.$$

The total output voltage at the output node 110, other than as adjusted by the trim arms 118, is a combination of the output voltage of the activated thermometric arms 102 and the output voltage of the activated binary arms 116. The $2^T-1$ thermometric arms 102 output a voltage proportional to the number of activated thermometric arms 102, accordingly, the number of thermometric arms 102 connected to VREF 114 by respective VREF switches 108. For example, for a number k activated thermometric arms 102 corresponding to an input code with a value of $(k \times 2^B)$, the R2R DAC 100 would ideally output a voltage of $$V_{out} = V_{ref} \times \frac{k \times 2^B}{2^N};$$

if four thermometric arms 102 are activated, the DAC would ideally output a voltage of $$V_{out} = V_{ref} \times \frac{4 \times 2^B}{2^N}.$$

The B binary arms 116 output a voltage proportional to a binary value expressed by setting bit positions to one corresponding to the bit significance of activated binary arms 116. Accordingly, the particular binary arms 116 are connected to VREF 114 by respective VREF switches 108. For example, activating third and fourth binary arms 116, corresponding to a binary input code portion 1100 with base ten value 12, would ideally output a voltage of $$V_{out} = V_{ref} \times \frac{12}{2^N}.$$

Process errors, such as resistance value mismatches (for example, deviations from designed resistance values), result in deviations from ideal voltage outputs, accordingly, INL and DNL errors.

The R2R DAC 100 can be referred to as a T×B segmented R2R DAC. For example, T can be five (five thermometric arms 102) and B can be thirteen (thirteen binary arms 116). This example corresponds to a 5×13 segmented R2R DAC.

Figure 2A:
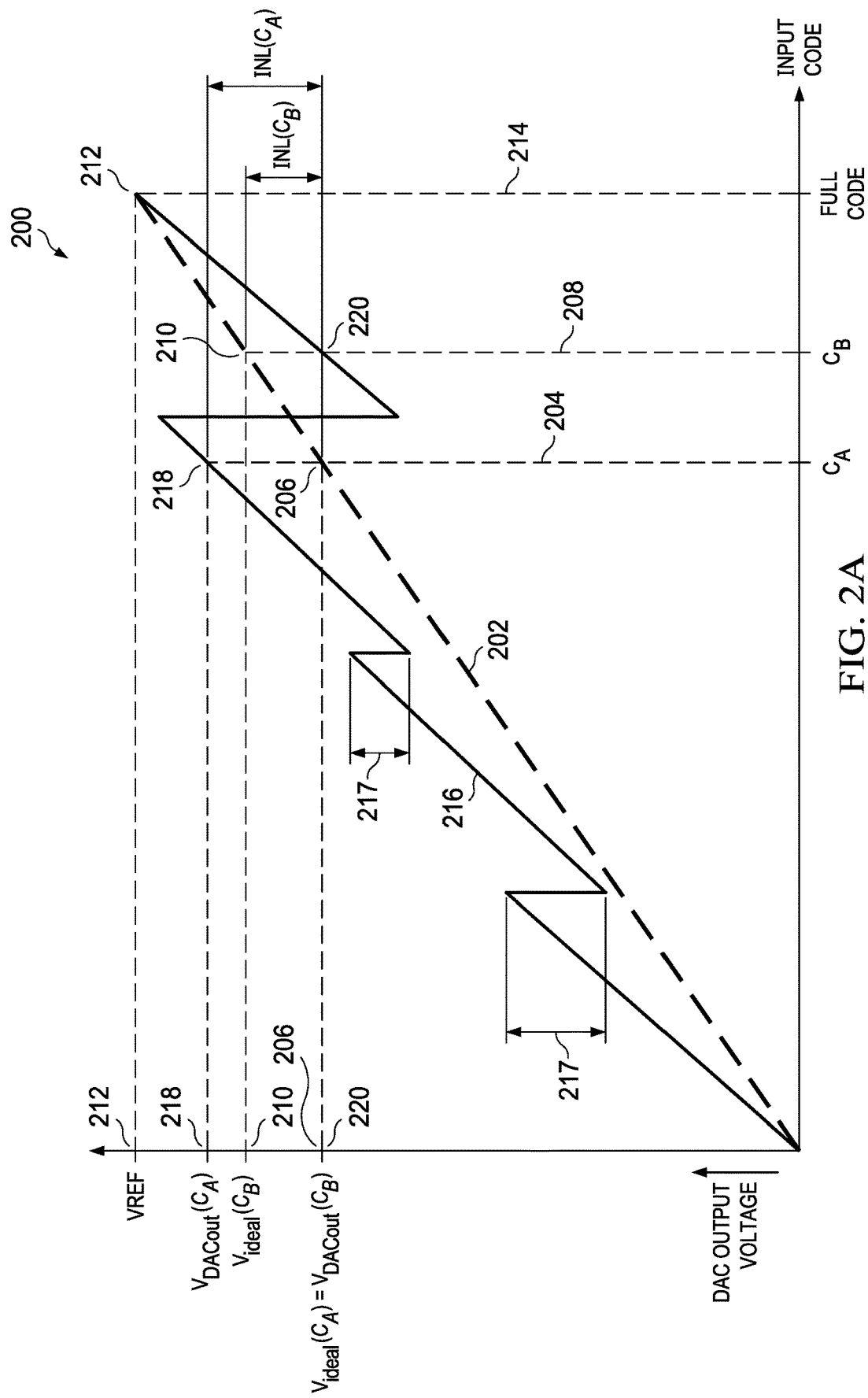
FIG. 2A shows a graph of example input code versus output voltage for the R2R DAC of FIG. 1.

Trimming a First Code to an Ideal Output by Finding a Second Code with a Matching Non-Ideal Output FIG. 2A shows a graph 200 of example input codes (horizontal axis) versus output voltages (vertical axis) for the R2R DAC 100 of FIG. 1. An ideal output voltage line 202 shows the ideal output voltage of the R2R DAC 100 for corresponding input codes. For an input code $C_A$ 204, this ideal output voltage can be represented as $V_{ideal}(C_A)$ 206, and for an input code $C_B$ 208, this ideal output voltage can be represented as $V_{ideal}(C_B)$ 210. ($C_B$ 208 is not necessarily the sequentially next code following $C_A$ 204.) VREF 212 corresponds to a maximum voltage output of the R2R DAC 100, which occurs when the input code has a maximum binary value (all ones, such as 11111 for a five bit input), referred to herein as a full code 214. An actual output voltage line 216 shows an example of an actual output voltage of the R2R DAC 100 for corresponding input codes. Actual output voltages include INL error and DNL error. Large sawtooth drops 217 correspond to negative DNL errors forced by the ΔR resistance mismatches in the MSB connector resistors 124a. These negative DNL errors correspond to activations of thermometric arms 102 and activations of MSB binary arms 116a. Accordingly, for the input code $C_A$ 204, the actual output voltage value is represented as $V_{DACout}(C_A)$ 218. The INL error of input code $C_A$ 204, expressed in voltage units, is referred to as $INL_V(C_A)$. The difference between the ideal voltage output and the actual voltage output for input code $C_A$ 204 can be expressed in terms of $INL_V(C_A)$, as is given by Equation 1:

$$V_{DACout}(C_A)=V_{ideal}(C_A)+INL_V(C_A) \quad \text{Equation 1}$$

If DNL errors of thermometric arms 102 and MSB binary arms 116a are forced to be negative, then, as shown by example in FIG. 2A, some output code $C_B$ 208 will have an actual output voltage $V_{DACout}(C_B)$ 220 (ideal voltage plus INL error) equal to the ideal output voltage of input code $C_A$, $V_{ideal}(C_A)$ 206. This relationship is described by Equation 2:

$$V_{ideal}(C_A)=V_{DACout}(C_B)=V_{ideal}(C_B)+INL_V(C_B) \quad \text{Equation 2}$$

Herein, the actual output voltage of output code $C_B$ 208 "equaling" the ideal output voltage of input code $C_A$ 206 means that the actual output voltage of $C_B$ 208 $V_{DACout}(C_B)$ 220 can be trimmed (finely adjusted) by the trim arms 118 to equal the ideal output voltage of $C_A$ 204 $V_{ideal}(C_A)$ 206, within the designed tolerance of the R2R DAC 100. Accordingly, the trim arms 118 can trim the actual output voltage to a resolution of $LSB \times 2^{-L}$, where LSB is the output voltage designed to be provided by the LSB binary arm 128 when activated (connected to VREF 114). This LSB voltage also corresponds to the ideal output voltage increment resulting from incrementing the input code by one. The LSB voltage, or $V_{LSB}$, can be found by dividing an actual output voltage at full code minus an actual output voltage at zero code by the full code:

$$V_{LSB}=(V_{DACout}(2N-1)-V_{DACout}(0))/(2N-1).$$

The voltage step from zero code to full code is correct—that is, accurate and without DNL error—as explained with respect to Equation 5 (describing endpoint correction).

The trim arms 118 correspond to fractional LSB voltages, for example, $LSB \times 2^{-1}$, $LSB \times 2^{-2}$, ..., $LSB \times 2^{-L}$. In some examples, the LSB extension represented by the trim arms 118 (which are digital) is highly accurate, due to DNL error from resistor mismatch in LSB arms (LSB binary arms 116b and trim arms 118) being small enough to be negligible. In some examples, the area and power impact of adding the trim arms 118 is also small enough to be negligible.

DNL errors of the R2R DAC 100 can be measured after manufacture (including encapsulation or other packaging) of a device that includes the R2R DAC 100, such as an integrated circuit (IC). DNL errors are measured at a known temperature, and are permanently stored in non-volatile memory on the device at a resolution of $LSB \times 2^{-L}$ (corresponding to the resolution enabled by the trim arms 118).

DNL errors are linearly dependent on temperature. In some examples, an R2R DAC 100 can store a slope relating DNL errors of the R2R DAC 100 to temperature. In response to temperature changes sensed by the temperature sensor 138, the R2R DAC 100 can determine new slopes, offsets, decision codes, and other values described below (see discussion with respect to Equations 3 through 48) using stored DNL values modified in response to the sensed temperature and stored DNL/temperature slope. In some examples, this temperature adjustment is made in response to a temperature change exceeding a threshold.

There are several advantages to implementing an architecture that (using a mapped output code $C_B$) results in an actual output voltage equaling the desired (ideal) output voltage for a different input code $C_A$, without additional correction (other than digitally controlled trim by the trim arms 118). For example, correction for $INL(C_A)$ using an auxiliary trim DAC (such as a current DAC (IDAC) or resistive DAC (RDAC)), whether analog or digital, can be avoided, enabling simpler and more area-efficient design. Further, correct output can be generated for high bit resolution (for example, eighteen bits) without directly determining $INL(C_A)$ and without determining an inverse INL $(C_A)$ function, including for DNL errors greater than one LSB. (In some examples, directly determining $INL(C_A)$ is relatively time consuming.) Also, in some examples, the R2R DAC 100 can provide output voltage as high as a voltage provided by a high voltage rail (for example, VREF 114), and as low as a voltage referenced by a low voltage rail (for example, ground 112), without additional voltage headroom or footroom. A process for mapping an input code $C_A$ to an output code $C_B$ according to Equation 2 is discussed below with respect to FIGS. 3 through 5B, and Equations 2 through 21.

Figure 2B:
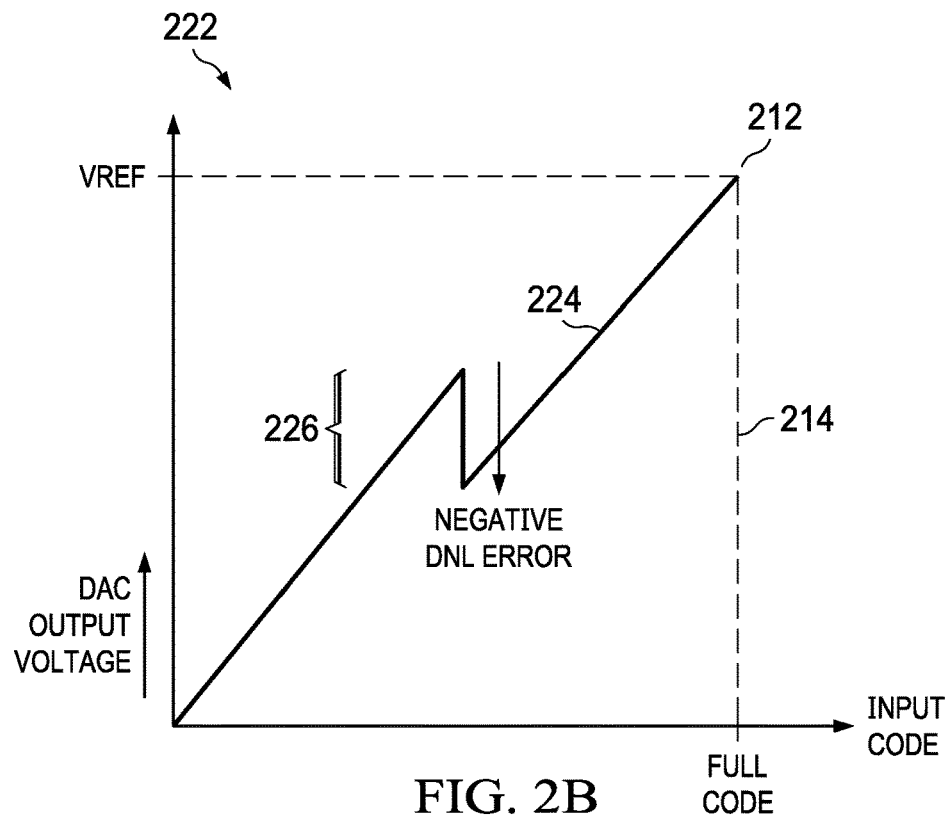
FIG. 2B shows a graph of example input code versus output voltage for the R2R DAC of FIG. 1.

FIG. 2B shows a graph 222 of example input code versus output voltage for the R2R DAC 100 of FIG. 1. An output voltage line 224 shows a negative DNL error 226, that is, a negative voltage error in the voltage step between sequential input codes. Forcing non-negligible DNL errors to be negative ensures there will be a code $C_B$ to which input code $C_A$ may be mapped that satisfies Equation 2. The MSB connector resistors 124a include a deliberate negative-value mismatch in their resistance (the negative delta R) to force corresponding DNL errors to be negative.

Figure 2C:
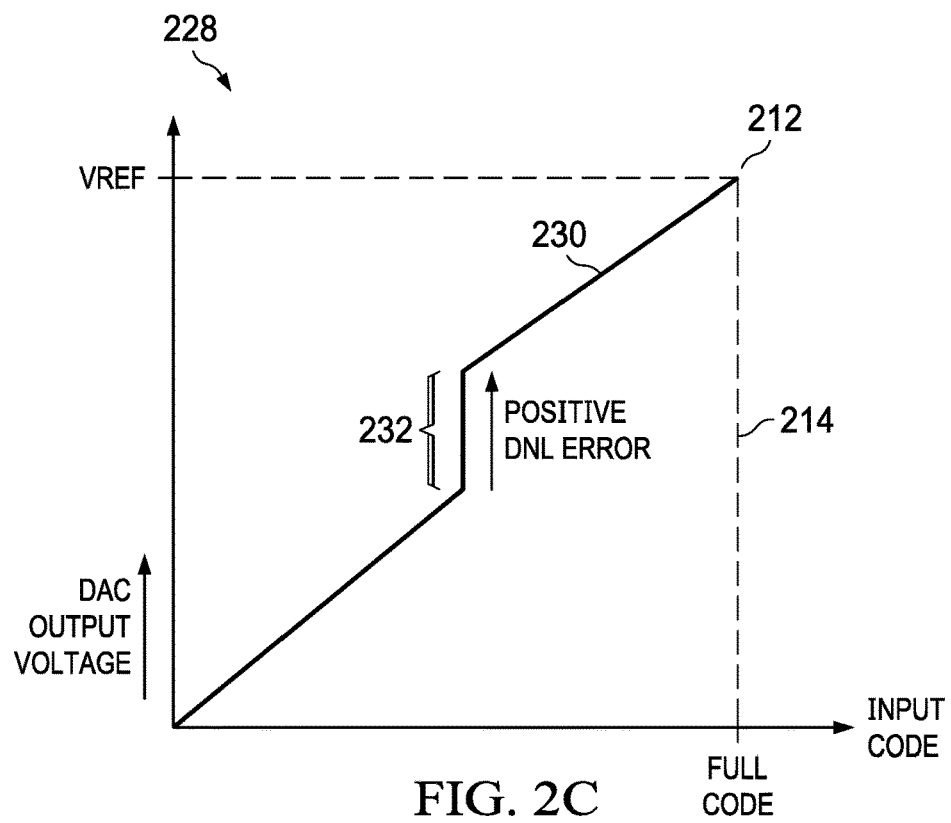
FIG. 2C shows a graph of example input code versus output voltage for the R2R DAC of FIG. 1.

FIG. 2C shows a graph 228 of example input code versus output voltage for the R2R DAC 100 of FIG. 1. An output voltage line 230 shows a positive DNL error 232. Positive DNL errors 232 corresponding to activation of thermometric arms 102 or MSB binary arms 116a can result in there being no code $C_B$ that satisfies Equation 2 for one or more input codes $C_A$, that is, there being no output code that will produce an actual output voltage corresponding to the ideal output voltage of the input code. As described above, deliberately introduced negative resistance value mismatches in MSB connector resistors 124a are used to avoid this outcome.

Figure 3:
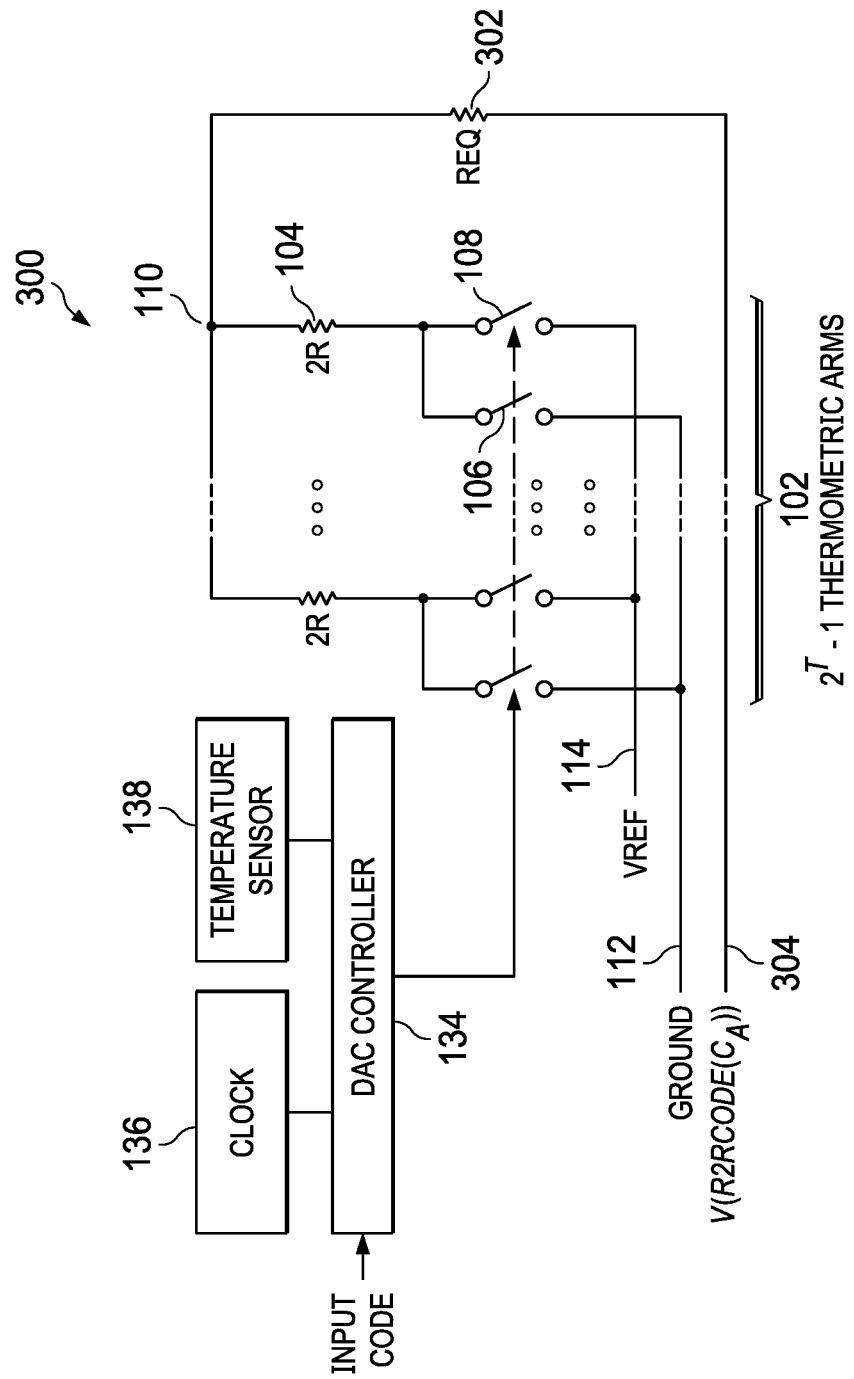
FIG. 3 shows an example of an equivalent circuit diagram of the R2R DAC of FIG. 1.

Determining Per-Significant Bit INL Error and Trim Using Per-Significant Bit DNL Error FIG. 3 shows an example of an equivalent circuit diagram 300 of the R2R DAC 100 of FIG. 1. To simplify explanation, the resistors other than the arm resistors 104 of the thermometric arms 102 have been replaced by an equivalent resistor 302 having an impedance Req equivalent to the replaced resistors. The equivalent resistor 302 has a first terminal and a second terminal. The first terminal is connected to the output terminal 110 of the R2R DAC 100, and the second terminal is connected to a voltage source 304 that has a voltage corresponding to an output of the R2R DAC 100 resulting from the portion of the input code $C_A$ that corresponds to the binary arms 116. The portion of the input code $C_A$ that corresponds to the binary arms 116 is referred to herein as R2RCode($C_A$), and the corresponding voltage is V(R2RCode($C_A$)).

A process of correction for errors of successively less-significant arms 102 and 116 starts with a model of R2R DAC 100 behavior represented by the diagram 300. For an input code $C_A$, errors corresponding to the thermometric arms 102 can be corrected while assuming that the binary arms 116 are ideal—accordingly, that connector resistors 124 and arm resistors 104 are perfectly matched. After correcting for errors introduced by the thermometric arms 102, errors introduced by the MSB binary arm 126 can be corrected while assuming that the rest of the binary arms 116 are ideal; and so on, for the remainder of the K MSB binary arms 116a. Accumulating these corrections produces an output code $C_B$ as described with respect to Equation 2. The iterative corrections of this process are described with respect to FIGS. 4 and 5, and the process is described with respect to FIG. 6.

Figure 4:
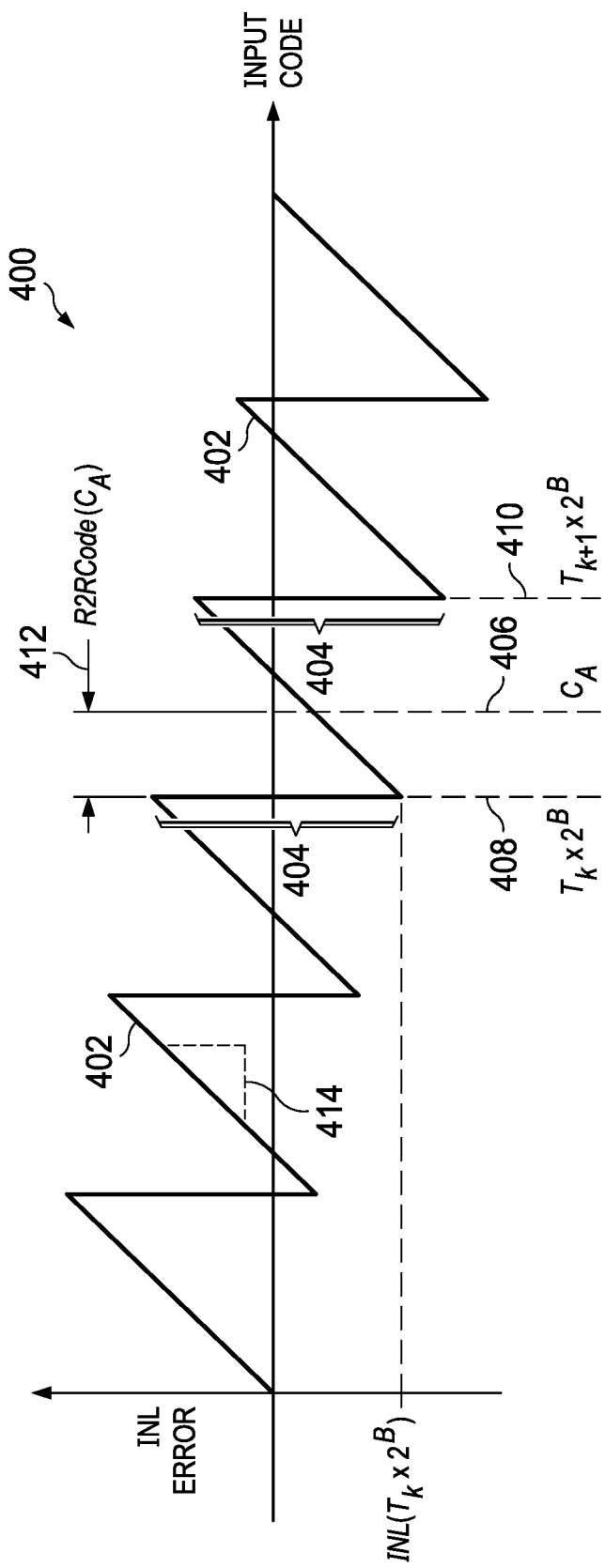
FIG. 4 shows a graph of an example of input code $C_A$ versus INL error contributions of the thermometric arms for the R2R DAC as modeled in FIG. 3.

FIG. 4 shows a graph 400 of an example of input code $C_A$ (horizontal axis) versus INL error (vertical axis) contributions of the thermometric arms 102 for the equivalent circuit diagram 300 modeled in FIG. 3. From FIG. 4 on, and in corresponding Equations, INL and DNL error, and other values, are considered in code increment units. This means that one unit of INL error and one unit of DNL error each equals one input code increment, corresponding to one LSB-equivalent voltage. INL error of input code $C_A$, expressed in code increment units, is referred to as $INL_C(C_A)$. Similarly, one DNL error of input code $C_A$, expressed in code increment units, is referred to as $DNL_C(C_A)$. For example, Equation 2 can equivalently be expressed as $$C_A \times LSB = C_B \times LSB + INL_C(C_B) \times LSB.$$

Accordingly, INL error voltage or DNL error voltage equaling zero is equivalent to INL error or DNL error expressed in code equaling zero.

In the INL error line 402, negative DNL errors 404 occur when a thermometric arm 102 activates. Intermediate, gradual changes in INL error, forming smooth lines of constant slope, occur as binary arms 116 are variously activated as the input code changes by one LSB at a time. For example, negative DNL errors 404 occur after activation of thermometric arms 102 numbered k and k+1.

Thermometric arms 102 numbered k and k+1 are represented herein as thermometric arms 102 $T_k$ and $T_{k+1}$. Activation of a thermometric arm 102 $T_k$ includes activation of all lower-numbered thermometric arms 102 $T_{k-1}$, $T_{k-2}$, ..., $T_1$. A weighted value for thermometric arm 102 $T_k$, corresponding to a portion of binary input code $C_A$ 406 indicating activation of thermometric arm 102 $T_k$, is represented herein as $(T_k \times 2^B)$ 408. (This also corresponds to an input code for activation only of thermometric arms 102 numbered up to and including k.) Similarly, a portion of binary input code $C_A$ 406 indicating activation of thermometric arm 102 $T_{k+1}$, is represented herein as $(T_{k+1} \times 2^B)$ 410. For example, referencing FIG. 1, B equals five and T equals three, so there are $2^7-1=7$ thermometric arms, and $T_k$ is (for example) the fourth thermometric arm 102 $T_4$. In this example, $T_k$ can be represented as decimal 4 or binary 100, and $T_k \times 2^B$ equals decimal $(T_k=4) \times (2^5=32)=$binary 10000000. As described with respect to FIG. 3, the portion of input code $C_A$ 406 that corresponds to the binary arms 116 is referred to herein as R2RCode($C_A$) 412. Accordingly, input code $C_A$ 406 can be separated into a thermometric arm 102 portion $(T_k \times 2^B$ 408$)$ and a binary arm 116 portion (R2RCode($C_A$) 412) as shown in Equation 3:

$$C_A = T_k \times 2^B + R2RCode(C_A) \quad \text{Equation 3}$$

The DNL errors 404 shown in the INL error line 402 for codes corresponding to thermometric arm 102 activation are all negative because of the intentional negative error (systematic mismatch) in the resistance of the MSB connector resistors 124a. The DNL errors 404 are unequal due to process mismatches in resistor values. However, the input code versus INL error slopes between the DNL errors 404, such as between $(T_k \times 2^B)$ 408 and the code immediately preceding $(T_{k+1} \times 2^B)$ 408 [specifically, $(T_{k+1} \times 2^B - 1)$], are constant. This slope is referred to herein as $Slope_{ErrTherm}$ 414 (which is expressed in code increment units). Accordingly, the INL error for an input code $C_A$ 406 can be broken into a contribution from the highest-order thermometric arm 102 activated by input code $C_A$ 406 (for example, thermometric arm $T_k$, corresponding to $T_k \times 2^B$ 408), and a contribution from the binary arms 116 (corresponding to R2RCode($C_A$) 412), as shown in Equation 4:

$$INL_C(C_A) = INL_C(T_k \times 2^B) + R2RCode(C_A) \times Slope_{ErrTherm} \quad \text{Equation 4}$$

$Slope_{ErrTherm}$ 414 is constant because the resistance of the equivalent resistor 302 ($R_{eq}$) is the same for each segment between activations of thermometric arms 102, and because the R2R DAC 100 is endpoint corrected. Endpoint correction means that the voltage output of the R2R DAC 100 will be ideal when the code equals zero, and when the code has a maximum value. When the code equals zero, all arm resistors 104 are disconnected from VREF 114 and switched to ground, resulting in a zero output voltage. When the code has a maximum value (is "full", so that all bits equal one, such as 11111111), all arm resistors 104 are connected to VREF 114, resulting in output voltage $$V_{out} = V_{ref} \times \frac{2^N - 1}{2^N}.$$

Because $Slope_{ErrTherm}$ 414 is constant, the graph of the INL error contribution of the thermometric arms 102 is piecewise linear. This means that for any code between adjacent activations of thermometric arms 102, such as $T_k$ and $T_{k+1}$, the INL error has a linear profile with two error components. These two error components are (1) offset, which is the INL error for a highest-order thermometric arm 102 $T_k$ activated by $C_A$ 406, and (2) slope $Slope_{ErrTherm}$ 414. The offset is different for each thermometric arm 102 $T_k$. $Slope_{ErrTherm}$ 414 can be viewed as the DNL error of each non-thermometric arm if the non-thermometric arm is ideal.

As described with respect to FIG. 3, $Slope_{ErrTherm}$ 414 can be calculated while considering only error in the thermometric arms 102, and assuming that other arms are ideal. The endpoint corrected nature of the R2R DAC 100 means that total DNL error for all possible input codes $C_A$ 406 is described by Equation 5:

$$\sum_{code=1}^{code=2^N-1} DNL_C(code) = 0 \quad \text{Equation 5}$$

DNL error (whether expressed in voltage units or code increment units) refers to the error in the voltage step between code i minus one (i−1) and code i (accordingly, DNL error is undefined at code zero), where i is an integer corresponding to a code. Equation 5 means that the voltage step from code zero to code $2^N-1$ (the maximum code), which is the voltage step between code endpoints, will be correct; put differently, the voltage at code zero will be free of INL error, and the voltage step from code zero to the maximum code will be free of DNL error, so that the voltage at the maximum code will be free of INL error. DNL error can be separated for the thermometric arms 102 and the binary arms 116. Equation 4 is applied to Equation 5, with the understanding that there are $2^N-1$ total codes and $2^T-1$ codes that result in transitioning a thermometric arm 102 to an activated state, to produce Equation 6:

$$\sum\nolimits_{i=1}^{i=2^T-1} DNL_C(T_i) + \text{Slope}_{ErrTherm} \times (2^N - 1 - (2^T - 1)) = 0 \qquad \text{Equation 6}$$

For an integer i, the DNL error in the $i^{th}$ thermometric arm 102 is referred to herein as $DNL_C(T_i)$. Equation 6 can be rearranged to solve for $\text{Slope}_{ErrTherm}$ 414 (recalling that $2^T \times 2^B = 2^N$), as shown in Equation 7:

$$\text{Slope}_{ErrTherm} = -1 \times \sum\nolimits_{i=1}^{i=2^T-1} DNL_C(T_i)/(2^T \times (2^B - 1)) \qquad \text{Equation 7}$$

Offset($T_k$), the INL error for a thermometric arm 102 $T_k$ (a thermometric arm 102), can be determined using $\text{Slope}_{ErrTherm}$. Offset($T_k$) for thermometric arm $T_k$ is the INL error for the code $T_k \times 2^B$ 408. Equation 8 shows the INL error of $T_k$, and Equation 9 rewrites Equation 8 using Equation 6 to separate $\text{Slope}_{ErrTherm}$ 414 from the DNL error contribution of the thermometric arms 102:

$$\text{Offset}(T_k) = \sum\nolimits_{code=1}^{code=k \times 2^B} DNL_C(\text{code}) \qquad \text{Equation 8}$$

$$\text{Offset}(T_k) = \sum\nolimits_{i=1}^{i=k} DNL_C(T_i) + (\text{Slope}_{ErrTherm} \times (k \times 2^B - k)) \qquad \text{Equation 9}$$

Substituting the value of $\text{Slope}_{ErrTherm}$ 414 from Equation 7 into Equation 9 gives Equation 10, which can be simplified to give Equation 11:

Equation 10

$$\text{Offset}(T_k) =$$

$$\sum\nolimits_{i=1}^{i=k} DNL_C(T_i) - k \times (2^B - 1) \times \frac{\sum_{j=1}^{j=2^T-1} DNL_C(T_j)}{2^T \times (2^B - 1)}$$

Equation 11

$$\text{Offset}(T_k) =$$

$$INL_C(T_k \times 2^B) = \sum\nolimits_{i=1}^{i=k} DNL_C(T_i) - k \times \frac{\sum_{j=1}^{j=2^T-1} DNL_C(T_j)}{2^T}$$

The INL error contribution from the thermometric arms 102 can be trimmed (corrected) by changing (or "modulating") $R2RCode(C_A)$ 412 while not changing $T_k \times 2^B$ 408. In Equation 2, $C_A$ and $C_B$ are substituted for using Equation 7, and $INL_V(C_B)$ is substituted for using Equation 3 (and converted to code increment units by dividing by LSB), to produce Equation 12:

$$T_k \times 2^B + R2RCode(C_A) = T_k \times 2^B + R2RCode(C_B) + INL_C$$
$$(T_k \times 2^B) + R2RCode(C_B) \times \text{Slope}_{ErrTherm} \qquad \text{Equation 12}$$

Equation 12 can be solved for $R2RCode(C_B)$ to give Equation 13; note that $INL_C(T_k \times 2^B)$ can be determined using DNL error, as shown in Equation 11:

$$R2RCode(C_A)_{ThermTrim} = \frac{R2RCode(C_A) - INL_C(T_k \times 2^B)}{1 + \text{Slope}_{ErrTherm}} \qquad \text{Equation 13}$$

If $R^2RCode(C_A)_{ThermTrim}$ is less than zero then k is decremented by one, and if $R^2RCode(C_A)_{ThermTrim}$ is greater than $2^B - 1$ then k is incremented by one, so that results for Equations 12 and 13 are re-determined using k modified to k−1 or k+1, respectively. Also, Equation 13, and Equations 16, 17, 20, and 21 (below), are real number calculations (for example, floating point calculations) that can have fractional results (because, for example, INL and DNL errors can be fractional). Because input and output codes are integers, there is a truncation step following Equation 13, 16, 17, 20, and 21 to determine control bits corresponding to respective thermometric arms 104 or MSB binary arms 116a (non-truncated values are passed from Equation to Equation to enable real number calculations). Trim arms 118 add to accuracy by enabling the R2R DAC 100 to address fractional values. The L output bits used to control the trim arms 118 (further described with respect to FIG. 6) are determined using the fractional amounts truncated from results for Equations 20 and 21.

Accordingly, the thermometric trim determination of Equation 13 uses thermometric code and binary code as inputs and, based on DNL information (and without requiring INL information) about the thermometric arms 102, determines a new code that fully trims (within design tolerances) for thermometric INL error. Mapping $R2RCode(C_A)$ to $R2RCode(C_A)_{ThermTrim}$ trims DNL error contribution from the thermometric arms 102, but does not trim DNL error contribution from the binary arms 116 (additional steps are performed to generate a final output code $C_B$ as described by Equation 2). Results of this thermometric trim step, as well as trimming DNL error contribution from the binary arms 116, are discussed below with respect to FIGS. 5A and 5B.

Figure 5A:
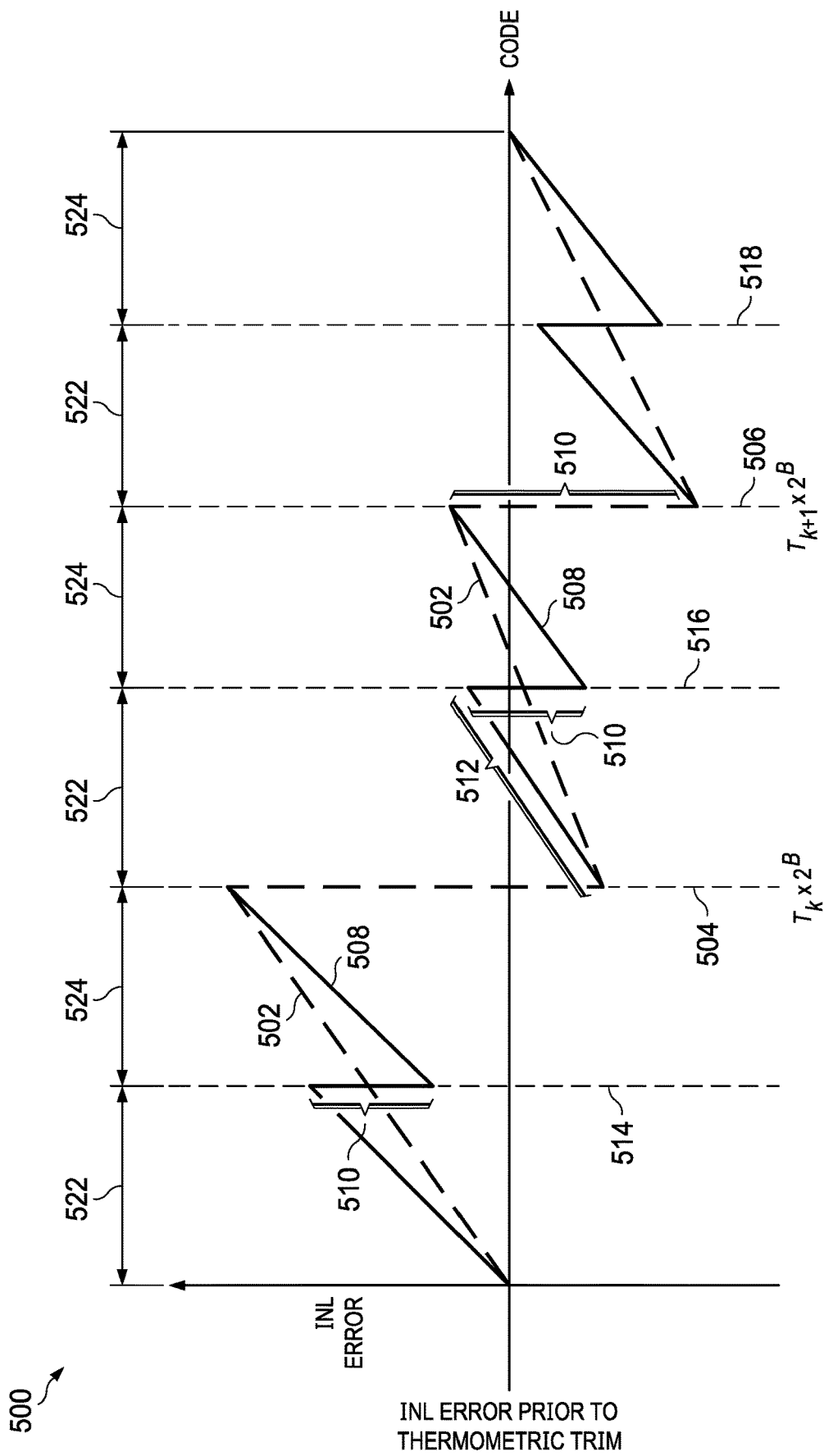
FIG. 5A shows an example graph of input code $C_A$ versus INL error for the R2R DAC of FIG. 1, prior to thermometric trim as described with respect to FIG. 4 and Equation 13.

FIG. 5A shows an example graph 500 of input code $C_A$ versus INL error for the R2R DAC 100 of FIG. 1, prior to thermometric trim as described with respect to FIG. 4 and Equation 13. A thermometric INL line 502 shows INL error contribution from the thermometric arms 102. A first dotted line 504 corresponds to a code $T_{k-1} \times 2^B$ at which a $(k-1)^{th}$ thermometric arm 102 switches from a deactivated state (connected to ground 112) to an activated state (connected to VREF 114). A second dotted line 506 corresponds to a code $T_k \times 2^B$ at which a $k^{th}$ thermometric arm 102 transitions from the deactivated state to the activated state.

An INL error line 508 shows INL slope, as well as DNL errors 510, corresponding to DNL error contribution from thermometric arms 102 and from the MSB binary arm 126. The INL error line 508 shows DNL errors 510 at codes at which a thermometric arm 102 or the MSB binary arm 126 transitions to an active state, resulting in offsets; offsets are INL errors commencing a line segment 512. Stepwise changes in INL error corresponding to DNL error contributions by thermometric arm 102 activations are shown at codes corresponding to first and second dotted lines 504 and 506 ($T_{k-1} \times 2^B$ and $T_k \times 2^B$). The INL error line 508 also shows DNL errors 510 at codes at which the MSB binary arm 126 activates. DNL errors 510 caused by MSB binary arm 126 activations correspond to a third dotted line 514 ($T_{k-2} \times 2^B + 2^B - 1$), a fourth dotted line 516 ($T_{k-1} \times 2^B + 2^B - 1$), and a fifth dotted line 518 ($T_k \times 2^B + 2^B - 1$). The DNL errors 510 resulting from thermometric arm 102 or MSB binary arm 126 activation will have negative voltages due to the deliberate negative resistance mismatch in the MSB connector resistors 124a corresponding to the MSB binary arms 116a.

Figure 5B:
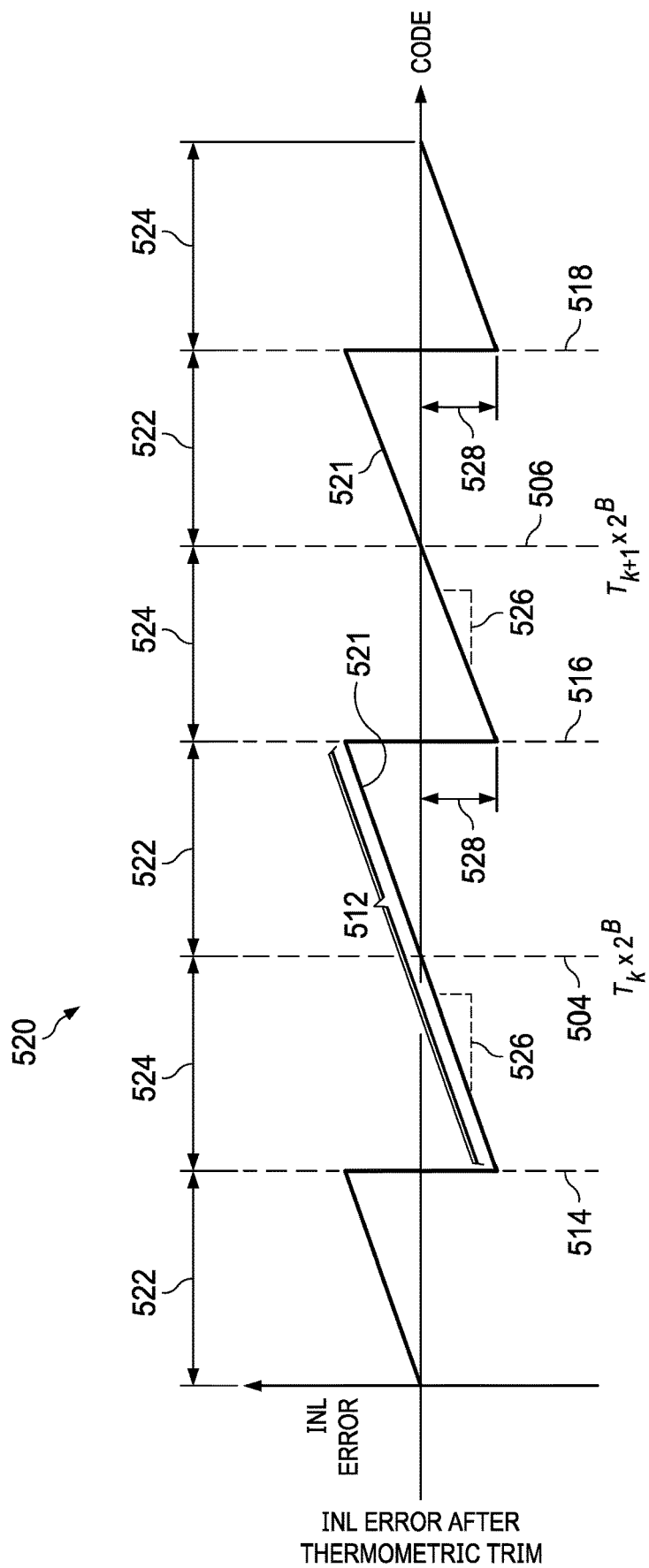
FIG. 5B shows an example graph of input code $C_A$ versus INL error for the R2R DAC of FIG. 1, after thermometric trim as described with respect to FIG. 4 and Equation 13.

FIG. 5B shows an example graph 520 of input code $C_A$ versus INL error for the R2R DAC 100 of FIG. 1, after thermometric trim as described with respect to FIG. 4 and Equation 13. Accordingly, the graph shows INL error contributions of the MSB binary arm 126 for $C_A$ as trimmed by mapping R2RCode($C_A$) to R2RCode($C_A$)$_{ThermTrim}$. DNL error contributions corresponding to activation of thermometric arms 102 codes $T_{k-1} \times 2^B$ and $T_k \times 2^B$ have been reduced to zero (within design tolerances) by the thermometric trim described with respect to FIG. 4 and Equation 13. Accordingly, line segments of the thermometric trimmed INL error line 521 in FIG. 5B extend from a code corresponding to an offset caused by a first activation of the MSB binary arm 126 (R2RCode component $2^B-1$), such as at the third dotted line 514, to the code immediately prior to an offset caused by a successively next, second activation of the MSB binary arm 126 (R2RCode component $2^{B-1}-1$), such as at the fourth dotted line 516.

The DNL errors 510 in the thermometric trimmed INL error line 521 have magnitude $DNL_C(MSB)$ (the DNL error contribution of the MSB binary arm 126). For example, if B equals five (there are five binary arms 116), then the MSB binary arm 126 transitions to an activated state when R2RCode($C_A$)=10000=$2^{B-1}$; accordingly, when the MSB transitions from zero to one. This occurs at codes corresponding to third, fourth, and fifth dotted lines 514, 516, and 518.

A first range 522 starts at a thermometric arm 102 transition, where the thermometric trimmed INL error equals zero (zero code and, equivalently, zero voltage) because of the applied thermometric trim. This corresponds to (for example) the first and second dotted lines 504 and 506. Iterating to these codes (iterating an R2RCode component from $2^B-1$ to zero), the MSB binary arm 126 transitions from an activated state to a deactivated state—from MSB equals one to MSB equals zero. The first range 522 ends where the thermometric trimmed INL error line 521 reaches a maximum INL error, corresponding to (for example) the codes immediately prior to the fourth dotted line 516 and the fifth dotted line 518 (R2RCode component $2^{B-1}-1$). From these codes to the successively next code (from R2RCode component $2^{B-1}-1$ to $2^B-1$), the MSB binary arm 126 transitions from a deactivated state to an activated state— from MSB equals zero to MSB equals one.

A second range 524 starts where the thermometric trimmed INL error has a minimum INL error voltage, which is where the MSB binary arm 126 transitions to an activated state (R2RCode component $2^B-1$). This corresponds to the codes at the third dotted line 514, the fourth dotted line 516, and the fifth dotted line 518. The second range 524 ends at codes immediately prior to codes corresponding to the INL error voltage equaling zero (R2RCode component $2^B-1$), which are immediately prior to codes at which thermometric arm 102 $T_{k-1}$ or $T_k$ transitions to an activated state; accordingly, immediately prior to the first dotted line 504 or the second dotted line 506 (respectively). Segments 512 of the thermometric trimmed INL error line 521 run from the beginning of a second range 524 to the end of a successively next first range 522.

The INL error at the start of the first range 522 equals zero, and the INL error at the end of the first range 522 equals $DNL_C(MSB)/2$. The INL error at the start of the second range 524 equals $-DNL_C(MSB)/2$, and the INL error at the end of the second range 524 equals zero. There are $2^{B-1}-1$ codes between each transition of the MSB from one to zero. Accordingly, the first range 522 has no INL error at the start of the range (an offset of zero), and has a slope $Slope_{ErrMSB}$ 526 described by Equation 14:

$$Slope_{ErrMSB} = \frac{DNL_C(MSB)/2}{2^{B-1}-1} \qquad \text{Equation 14}$$

The second range 524 has INL error of $-DNL_C(MSB)/2$ at the start of the range (an offset of $-DNL_C(MSB)/2$) and the same slope error $Slope_{ErrMSB}$ 526 as described in Equation 14. Accordingly, each segment 512 of the thermometric trimmed INL error line 521 has a piecewise linear profile with a slope error component $Slope_{ErrMSB}$ 526 described by Equation 14, and an offset error component $Offset_{MSB}$ 528 described by Equation 15:

$$Offset_{MSB} = -\frac{DNL_C(MSB)}{2} \qquad \text{Equation 15}$$

This slope and offset INL error contributions of the MSB binary arm 126 can be trimmed (corrected) by mapping the MSB−1 LSBs of R2RCode($C_A$)$_{ThermTrim}$. If R2RCode($C_A$)$_{ThermTrim}$ is less than $2^{B-1}$, meaning that the MSB equals zero, then R2RCode($C_A$)$_{ThermTrim}$ is in range one 522. In this case, the INL error contributions of the MSB binary arm 126 are trimmed by mapping the B−1 LSBs of R2RCode($C_A$)$_{ThermTrim}$ to R2RCode($C_A$)$_{MSBTrim}$ as shown in Equation 16, using the value of $Slope_{ErrMSB}$ 526 given in Equation 14:

$$R2RCode(C_A)_{MSBTrim} = \frac{R2RCode(C_A)_{ThermTrim}}{1+Slope_{ErrMSB}} \qquad \text{Equation 16}$$

If R2RCode($C_A$)$_{ThermTrim}$ is greater than or equal to $2^{MSB}$, meaning that the MSB equals one, then R2RCode($C_A$)$_{ThermTrim}$ is in range two 524. In this case, the INL error contributions of the MSB binary arm 126 are trimmed by mapping the B−1 LSBs of R2RCode($C_A$)$_{ThermTrim}$ to R2RCode($C_A$)$_{MSBTrim}$ as shown in Equation 17. Using the value of $Slope_{ErrMSB}$ 526 given in Equation 14 and the value of $Offset_{MSB}$ 528 given in Equation 15, Equation 17 is:

$$R2RCode(C_A)_{MSBTrim} = \frac{\left(R2RCode(C_A)_{ThermTrim} - 2^{B-1}\right) - Offset_{MSB}}{1+Slope_{ErrMSB}} + 2^{B-1} \qquad \text{Equation 17}$$

The trimming process shown in Equations 16 and 17 is repeated for each binary arm 116 that requires trimming: each MSB binary arm 116a. For a number K MSB binary arms 116a to be trimmed, the general equation for trimming an MSB binary arm 116a corresponding to a number i MSB, wherein the MSB binary arm 126 is the first MSB (i=1), is similar to Equations 16 and 17. (Recall that the INL error corresponding to a binary arm's 116 or thermometric arm's 102 transition is the same as the resulting offset.) Trimming is performed recursively for the first bit to the Kth bit. R2RCode($C_A$)$_{MSB(i-1)Trim}$ refers to the trim mapping result for the next-higher significance (immediately previous) bit, $MSB_{i-1}$ (for i=1, this refers to the thermometric arm 102 result). For $MSB_i$, slope and offset are given by Equations 18 and 19, respectively:

$$\text{Slope}_{ErrMSBi} = \frac{DNL_C(MSB_i)}{2} \bigg/ \left(2^{B-i} - 1\right) \quad \text{Equation 18}$$

$$\text{Offset}_{MSBi} = -\frac{DNL_C(MSB_i)}{2} \quad \text{Equation 19}$$

In a range where $R2RCode(C_A)_{MSB(i-1)Trim}$ is less than $2^{B-i}$, meaning that bit $MSB_i$ equals zero, the INL error contributions of the $i^{th}$ binary arm 116 are trimmed by mapping the B−i LSBs of $R2RCode(C_A)_{MSB(i-1)Trim}$ to $R2RCode(C_A)_{MSBiTrim}$ as shown in Equation 20, using the value of $\text{Slope}_{ErrMSBi}$ given in Equation 18:

$$R2RCode(C_A)_{MSBiTrim} = \frac{R2RCode(C_A)_{MSB(i-1)Trim}}{1 + \text{Slope}_{ErrMSBi}} \quad \text{Equation 20}$$

In a range where $R2RCode(C_A)_{MSB(i-1)Trim}$ is greater than or equal to $2^{B-i}$, meaning that bit $MSB_i$ equals one, the INL error contributions of the $i^{th}$ binary arm 116 are trimmed by mapping the B−i LSBs of $R2RCode(C_A)_{MSB(i-1)Trim}$ to $R2RCode(C_A)_{MSBiTrim}$ as shown in Equation 21. Using the value of $\text{Slope}_{ErrMSBi}$ given in Equation 18 and the value of $\text{Offset}_{MSBi}$ given in Equation 19, Equation 21 is:

$$R2RCode(C_A)_{MSBiTrim} = \quad \text{Equation 21}$$
$$\frac{\left(R2RCode(C_A)_{MSB(i-1)Trim} - 2^{B-i}\right) - \text{Offset}_{MSBi}}{1 + \text{Slope}_{ErrMSBi}} + 2^{B-i}$$

Accordingly, significant INL error sources of the R2R DAC 100, corresponding to the thermometric arms 102 and the MSB binary arms 116a, can be trimmed using DNL error information of the thermometric arms 102 and the MSB binary arms 116a. This trim, along with the addition of a small number of digital trim arms 118, is sufficient to enable the R2R DAC 100 to output with high accuracy at full N bit resolution, and without an additional headroom or footroom requirement (for example, with a voltage range from ground to VREF, or from zero volts to an input voltage, or from a low voltage rail to a high voltage rail (making the R2R DAC 100 a "rail to rail" DAC)). This DNL error information-based trim also does not require direct INL error measurement. (INL error is determined as a function of DNL error, as shown in, for example, Equations 11 and 15.) This enables efficient digital implementation, as discussed with respect to, for example, FIGS. 7A through 9C, which describe an approach to direct determination of output code from input code.

Figure 6:
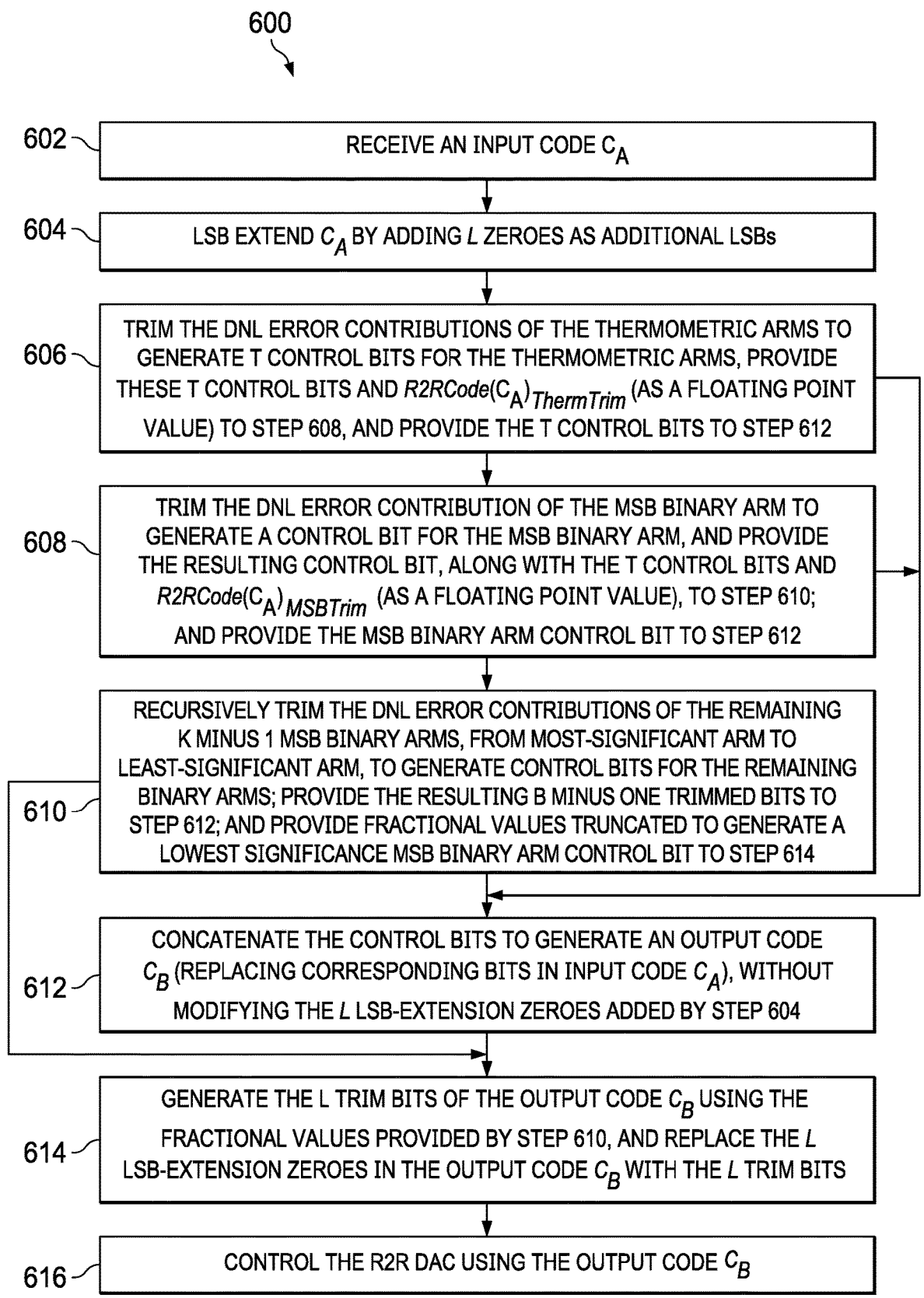
FIG. 6 is a flow diagram of an example process for a DAC controller to use to map an input code $C_A$ to an output code $C_B$ to control the R2R DAC of FIG. 1.

FIG. 6 shows an example process 600 for the DAC controller 134 to use to map an input code $C_A$ to an output code $C_B$ to control the R2R DAC 100 of FIG. 1. FIG. 6 summarizes the iterative approach to digital trimming using the R2R DAC 100 of FIG. 1 described with respect to FIGS. 3 through 5 and Equations 2 through 21.

In step 602, an input code $C_A$ is received (e.g., as an input to DAC controller 134). In step 604, the input code $C_A$ is LSB extended by adding L zeroes (corresponding to the number of LSBs added by the trim arms 118) as additional LSBs. This is equivalent to multiplying the (binary) input code $C_A$ by $2^L$. For example, for a five bit input code 11111 and three trim arms 118, the LSB extended code is 11111000. In step 606, the DNL error contributions of the thermometric arms 102 are trimmed as described with respect to Equation 13. Step 606 produces T bits that are not changed by subsequent trimming steps, corresponding to control bits for the thermometric arms 102. These T control bits and $R2RCode(C_A)_{ThermTrim}$ (as a floating point value) are provided to step 608 for trimming of less significant bits, and the T control bits are provided to step 612 for concatenation to form output code $C_B$. In step 608, the DNL error contribution of the MSB binary arm 126 is trimmed as described with respect to Equations 16 and 17. Step 608 produces an MSB that is not changed by subsequent trimming steps, corresponding to a control bit for the MSB binary arm 126. This MSB control bit is provided, along with the T control bits and $R2RCode(C_A)_{MSBTrim}$ (as a floating point value), to step 610 for trimming of less significant bits; and the MSB control bit is provided to step 612 for concatenation to form output code $C_B$.

In step 610, DNL error contributions of the MSB binary arms 116a other than the MSB binary arm 126 are recursively trimmed, from most-significant arm to least-significant arm, as described with respect to Equations 20 and 21. This repetition of step 610 results in an additional B minus one trimmed control bits: the K minus one MSB bits trimmed by step 610, plus the B minus K bits corresponding to the LSB binary arms 116b (the B bits corresponding to the binary arms 116 are controlled according to the output obtained after determining results for Equation 20 or 21 for the least significant MSB binary arm 116a). The B minus one control bits are provided to step 612 for concatenation to form output code $C_B$; and fractional values truncated to generate the control bit for the lowest significance MSB binary arm 116a (the Kth MSB binary arm 116a of the K MSB binary arms 116a) are provided to step 614 to generate the L trim bits of output code $C_B$. In step 612, the trimmed code bits provided by steps 606 through 610 are concatenated to form output code $C_B$ (replacing corresponding bits in input code $C_A$). In step 614, the fractional values provided by step 610 are used to generate the L trim bits of output code $C_B$; the L trim bits replace (by arithmetic addition) the zeroes appended by step 604. In step 616, the DAC controller 134 controls the R2R DAC 100 using output code $C_B$.

A Graph of Output Code Minus Input Code is Piecewise Linear; Delta Codes

FIGS. 7A and 7B provide a comparison of a graph 700 of untrimmed INL versus input code $C_A$, to a graph 712 of delta code versus input code $C_A$, where delta code equals the output code minus the input code (the total adjustment made to map $C_A$ to $C_B$ as counted in LSBs, not counting multiplication by $2^L$ to LSB to extend the output code to account for the trim arms 118). Accordingly, delta code is determined as shown in Equation 22, for input code $C_A$ and output code $C_B$ (see Equation 2):

$$C_A + \text{Delta Code} = C_B \quad \text{Equation 22}$$

A direct correspondence between input code and output code is described below using delta codes, which are determined using DNL error information. This correspondence is described with respect to FIGS. 7A through 9C and Equations 22 through 48, and in light of the Equations described above.

FIG. 7A shows a graph 700 of an example of input code $C_A$ versus untrimmed INL error for the R2R DAC 100 of FIG. 1. The horizontal axis corresponds to input code of the R2R DAC 100. The vertical axis measures untrimmed INL error of the R2R DAC 100 output resulting from the input code in code increment units.

FIGS. 7A and 7B address an example R2R DAC 100 in which N (total resolution) equals seven, T (thermometric bits) equals two, B (binary bits) equals five, L (trim bits) equals three, and K (MSB arms 116a, each of which corresponds to an MSB connector resistor 124a with a negative resistance mismatch, as described with respect to FIG. 1) equals two. The MSB arms 116a are a first MSB binary arm 116a with significance $2^{B-1}$ and a second MSB binary arm 116a with significance $2^{B-2}$. The second MSB binary arm 116a transitions to an activated state at input codes that are multiples of eight that are not divisible by sixteen. For example, the second MSB binary arm 116a transitions to an activated state at input codes 8, 24, and 40. The first MSB binary arm 116a transitions to an activated state at input codes that are multiples of sixteen that are not divisible by thirty-two. For example, the first MSB binary arm 116a transitions to an activated state at input codes 16, 48, and 80. The thermometric arms 102 successively transition to an activated state at input codes that are multiples of thirty-two. For example, a first dotted line 702 indicates a thermometric arm 102 state transition at input code 32, a second dotted line 704 indicates a thermometric arm 102 state transition at input code 64, and a third dotted line 706 indicates a thermometric arm 102 state transition at input code 96.

An untrimmed INL error curve 708 indicates the INL error at corresponding input codes $C_A$ in code increment units. Negative DNL errors 710 can be seen at codes corresponding to major code transitions. Major code transitions are input codes where one of the $2^T-1$ thermometric arms 102 or one of the K MSB binary arms 116a transitions to an activated state. Each major code transition results in a corresponding negative DNL error 710.

Delta Code Decision Codes

FIG. 7B shows a graph 712 of an example of input code $C_A$ versus delta code for the R2R DAC 100 of FIG. 1. The horizontal axis corresponds to input code of the R2R DAC 100. The vertical axis corresponds to delta code corresponding to the input code, pursuant to Equation 22.

A delta code curve 714 indicates the delta code at a corresponding input code $C_A$. The delta code curve 714 is piecewise linear as a result of the piecewise linearity of the INL error curve 708 of FIG. 7A. (This relationship emerges from Equations 2 through 21, mapping $C_A$ to $C_B$.) Accordingly, the delta code curve 714 is comprised of a series of delta code line segments 716. The delta code curve 714 is discontinuous at various input codes, referred to herein as decision codes 718. The delta code curve 714 undergoes stepwise positive changes greater than one code unit at decision codes 718. These positive stepwise changes correspond to, trim for, and can be determined using stepwise DNL error at respective major code transitions. At a decision code 718, the delta code curve 714 is displaced from zero by an offset 720. Accordingly, the offset 720 is the delta code (y value) corresponding to a decision code 718 (x value).

Decision codes 718 are related to corresponding transitions of thermometric arms 102 or MSB binary arms 116a to an activated state. Accordingly, decision codes 718 are related to major code transitions. However, decision codes 718 can be different from major code transitions. For example, the first dotted line 702 is located at the thermometric arm 102 major code transition at input code 32. The first dotted line 702 intersects the delta code curve 714 prior to the corresponding decision code 718, which is located at input code 34. The second dotted line 704 is located at the thermometric arm 102 major code transition at input code 64. The second dotted line 704 intersects the delta code curve 714 at the corresponding decision code 718, also at input code 64. The third dotted line 706 is located at the thermometric arm 102 major code transition at input code 96. The third dotted line 706 intersects the delta code curve 714 after the corresponding decision code 718, which is located at input code 95.

Figure 8:
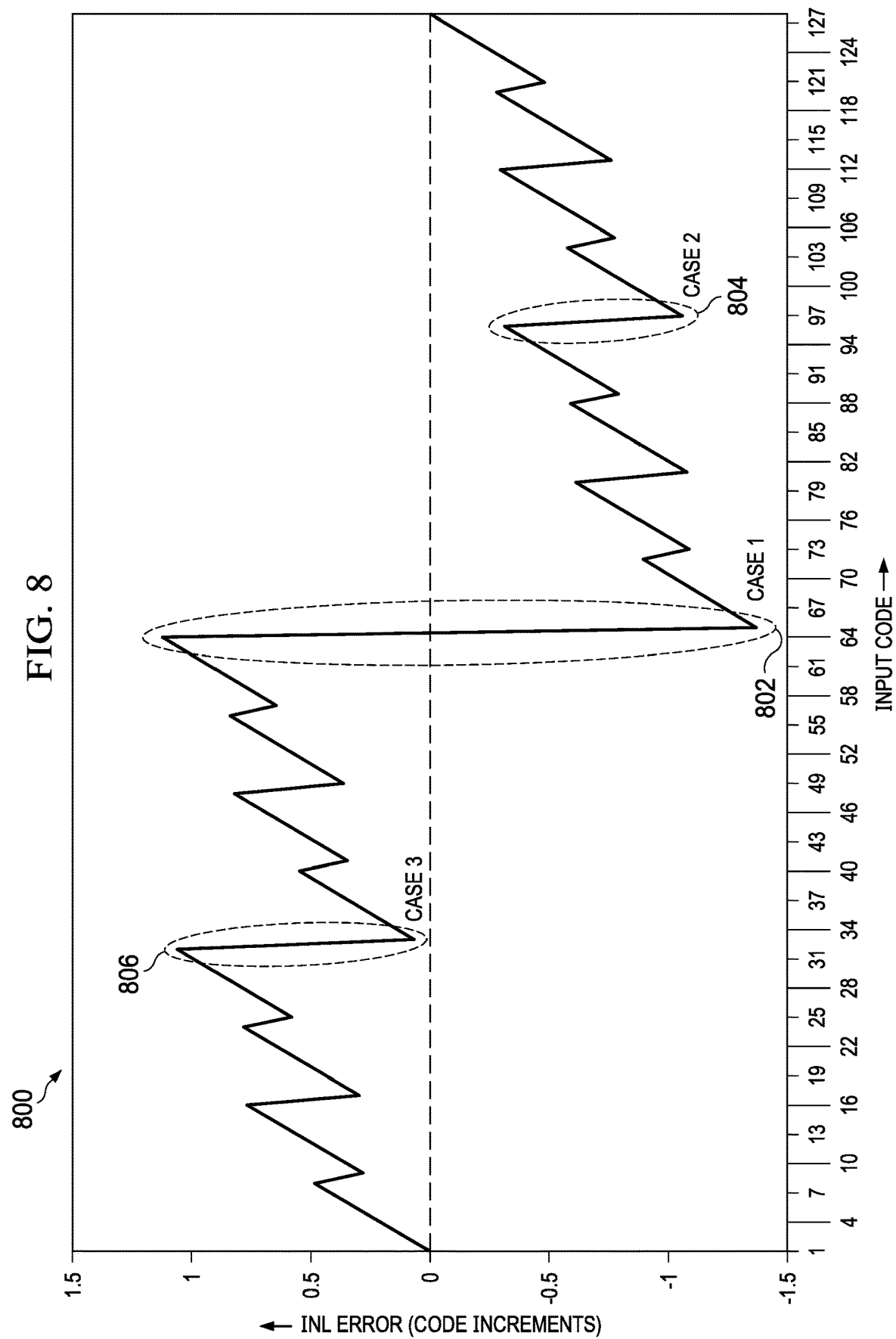
FIG. 8 shows a graph of an example of input code $C_A$ versus untrimmed INL error for the R2R DAC of FIG. 1.

FIG. 8 shows a graph 800 of an example of input code $C_A$ versus untrimmed INL error for the R2R DAC 100 of FIG. 1. The horizontal axis corresponds to input code of the R2R DAC 100. The vertical axis measures in code increment units INL error at the output of the R2R DAC 100 resulting from the R2R DAC 100 receiving the input code. This relationship can be determined using measured DNL errors of the R2R DAC 100.

Decision codes 718 can be determined from untrimmed DNL errors of major code transitions. Usefully, the INL error of an input code minus the DNL error of the input code equals the INL error of the previous input code (Equation 25). Equation 23 shows the relationship between ideal output voltage for an input code $C_A$ and ideal output voltage for input code $C_A$ minus one:

$$V_{ideal}(C_A) - V_{ideal}(C_A - 1) = V_{LSB} \qquad \text{Equation 23}$$

Equation 24 reworks Equation 23, using Equation 1, to show the relationship between actual output voltage for an input code $C_A$ and actual output voltage for input code $C_A$ minus one:

$$V_{ideal}(C_A) + INL_V(C_A) - V_{ideal}(C_A - 1) - INL_V(C_A - 1) = V_{LSB} + INL_V(C_A) \qquad \text{Equation 24}$$

Equation 25 subtracts Equation 23 from Equation 24 to show the relationship between INL error and DNL error (which is true for error expressed in voltage units or code increment units):

$$INL(C_A) - DNL(C_A) = INL(C_A - 1) \qquad \text{Equation 25}$$

The relationship between decision codes 718 and related major code transitions is discussed below with respect to thermometric arm 102 state transitions, and then with respect to MSB binary arm 116a state transitions. For a thermometric arm 102 major code transition of thermometric arm 102 $T_k$, this relationship can be separated into three cases, each of which is illustrated in FIG. 8.

In case 1 802, $INL_C(T_k \times 2^B) - DNL_C(T_k \times 2^B) \geq 0$ and $INL_C(T_k \times 2^B) \leq 0$ Equivalently, $INL_C(T_k \times 2^B) \leq 0$ and $INL_C(T_k \times 2^B - 1) \geq 0$. As such, INL error at the thermometric arm 102 transition is less than or equal to zero, and INL error at the previous input code is greater than or equal to zero. In case 2 804, $INL_C(T_k \times 2^B) - DNL_C(T_k \times 2^B) \leq 0$. As described with respect to FIG. 1, DNL error of major code transitions is required to be negative, which means that in case 2, INL error for input code $T_k \times 2^B$ is also negative. Equivalently, $INL_C(T_k \times 2^B) \leq 0$ and $INL_C(T_k \times 2^B - 1) \leq 0$. In case 3 806, $INL_C(T_k \times 2^B) - DNL_C(T_k \times 2^B) \geq 0$ and $INL_C(T_k \times 2^B) \geq 0$. Equivalently, $INL_C(T_k \times 2^B) \geq 0$ and $INL_C(T_k \times 2^B - 1) \geq 0$. As such, INL errors of the thermometric arm 102 major code transition, and at the previous input code, are both greater than or equal to zero. (Cases overlap if certain INL or DNL errors equal zero; in this situation, either overlapping case can be used to obtain correct results.) The INL error at $T_k \times 2^B$ can be found using Equation 11.

In case 1 802, the decision code 718 occurs at the same code (ignoring trim arm 118 LSB extension) as the thermometric arm 102 major code transition. This is because $INL_C(T_k \times 2^B) < 0$, which motivates modifying the decision code 718 to correspond to a lower value code, and $INL_C$ $(T_k \times 2^B-1) > 0$, which motivates modifying the decision code 718 to correspond to a higher value code. Accordingly, Equation 26 gives the decision code 718 for a thermometric arm 102 transition for thermometric arm 102 $T_k$ (Decision Code$_{Therm(k)}$) corresponding to case 1 802:

$$\text{Decision Code}_{Therm(k)} = T_k \times 2^B \quad \text{Equation 26}$$

In case 2 804, the decision code 718 occurs at a lower value code (ignoring the trim arm 118 LSB extension) than the thermometric arm 102 transition. This is because $INL_C(T_k \times 2^B) < 0$ and $INL_C(T_k \times 2^B-1) < 0$, both of which motivate modifying the decision code 718 to correspond to a lower value code. To calculate the decision code 718, consider Equation 13 with respect to thermometric arm 102 $T_{k-1}$. Accordingly, for an input code at which the R2RCode($C_A$)$_{ThermTrim}$ becomes greater than $2^B-1$, the thermometric portion of the code is increased from k−1 to k to trim $C_A$. Equation 27 represents this code change, noting that $T_{k-1} \times 2^B$ equals $T_k \times 2^B - 1 \times 2^B$:

$$R2RCode(C_A)_{ThermTrim} = \frac{(C_A - (T_k - 1) \times 2^B) - \text{Offset}(T_{k-1})}{1 + \text{Slope}_{ErrTherm}} \quad \text{Equation 27}$$

Solving for $C_A$ gives the decision code 718. Equation 27 is rearranged to give Equation 28, and the solution is provided by Equation 29:

$$C_A = T_k \times 2^B + \text{Offset}(T_{k-1}) + \text{Slope}_{ErrTherm} \times (2^B-1) = \text{Decision Code}_{Therm(k)} \quad \text{Equation 28}$$

Equation 29 relates $INL(T_{k-1} \times 2^B)$ to $INL(T_k \times 2^B-1)$:

$$\text{Offset}(T_{k-1}) + \text{Slope}_{ErrTherm} \times (2^B-1) = INL_C(T_k \times 2B-1) \quad \text{Equation 29}$$

Substituting Equation 29 into Equation 28 gives Equation 30, and solves for Decision Code$_{Therm(k)}$ for case 2 804:

$$\text{Decision Code}_{Therm(k)} = T_k \times 2^B + INL_C(T_k \times 2^B - 1) \quad \text{Equation 30}$$

In case 3 806, the decision code 718 occurs at a higher value code than the thermometric arm 102 major code transition, because $INL_C(T_k \times 2^B) > 0$ and $INL_C(T_k \times 2^B-1) > 0$ (both of which motivate modifying the decision code 718 to correspond to a higher value code). To avoid trimmed R2RCode($C_A$) being negative, R2RCode($C_A$) is required to be at least zero after transition from input code $T_k \times 2^B - 1$ to $T_k \times 2^B$. To calculate the decision code 718, consider Equation 13 with respect to thermometric arm 102 $T_k$ to produce Equation 31:

$$R2RCode(C_A)_{ThermTrim} = \frac{(C_A - T_k \times 2^B) - \text{Offset}(T_k)}{1 + \text{Slope}_{ErrTherm}} = 0 \quad \text{Equation 31}$$

In Equation 31, $C_A$ corresponds to Decision Code$_{Therm(k)}$ for case 3 806. Solving for $C_A$ in Equation 31 gives Equation 32:

$$C_A = \text{Decision Code}_{Therm(k)} = T_k \times 2^B + \text{Offset}(T_k) \quad \text{Equation 32}$$

The decision code 722 for a major code corresponding to the MSB binary arm 126 Decision Code$_{MSB}$ can be determined using Equation 13, given that the previous thermometric decision code 718 is Decision Code$_{Therm(k)}$ and the pre-trim INL error at Decision Code$_{Therm(k)}$ is Offset($T_k$). For codes $C_A$ at which R2RCode($C_A$)$_{ThermTrim}$ transitions to be greater than or equal to $2^{MSB}$ ($2^{B-1}$) the output code's MSB will become one. Accordingly, Equation 33 expresses this relationship:

$$R2RCode(C_A)_{ThermTrim} = \quad \text{Equation 33}$$
$$\frac{(C_A - \text{Decision Code}_{Therm(k)}) - \text{Offset}(T_k)}{1 + \text{Slope}_{ErrTherm}} = 2^{B-1}$$

In Equation 33, Decision Code$_{MSB}$ equals $C_A$ and R2RCode($C_A$)$_{ThermTrim}$ equals $2^{B-1}$. Accordingly, Equation 33 can be rearranged to give Decision Code$_{MSB}$, as shown by Equation 34:

$$\text{Decision Code}_{MSB} = 2^{B-1} \times (1 + \text{Slope}_{ErrTherm}) + \text{Offset}(T_k) + \text{Decision Code}_{Therm(k)} \quad \text{Equation 34}$$

The decision code for a major code corresponding to an $i^{th}$ MSB binary arm 116a MSB$_i$, Decision Code$_{MSBi}$, is determined using an approach similar to Equations 33 and 34. This determination is made using information regarding a major code that is a nearest previous (codewise) higher significance major code with respect to the major code for which the decision code is being generated (a nearest previous major code, or npmc). MSB$_i$ equals npmc+$2^{B-i}$, and the decision code for npmc is Decision Code$_{npmc}$. Accordingly, Decision Code$_{MSBi}$ equals the sum of Decision Code$_{npmc}$, plus the arm weight for MSB$_i$ times the product of the error slopes for all higher significance arms (each error slope term having the form $(1 + \text{Slope}_{Err(arm)})$), plus an offset term multiplied by the product of the error slopes for all arms that are higher significance than the arm corresponding to the offset term (except if the offset term is for a thermometric arm, for which there are no higher significance arms). The offset term used is the one corresponding to npmc. Decision Code$_{MSBi}$ is given by Equation 35:

$$\text{Decision Code}_{MSBi} = \text{Decision Code}_{npmc} + 2^{B-i} \times (1 + \text{Slope}_{ErrTherm}) \times (1 + \text{Slope}_{ErrMSB1}) \times \ldots \times (1 + \text{Slope}_{ErrMSB(i-1)}) + \text{Offset}(npmc) \times \prod_{j=0}^{j=npmc}(1 + \text{Slope}_{ErrArm(j-1)}) \quad \text{Equation 35}$$

In Equation 35, Slope$_{ErrArm(-1)}$ (j=0, corresponding to a major code activating a thermometric arm 104) equals zero, Slope$_{ErrArm(0)}$ (j=1, corresponding to MSB$_i$) equals Slope$_{ErrTherm}$, and for j≥2, Slope$_{ErrArm(j-1)}$ equals Slope$_{ErrMSB(j-1)}$.

Delta Code Slope and Offsets

Constructing the delta code curve 714 using decision codes 718, slope, and offsets 720 corresponding to individual delta code line segments 716 enables efficient real-time search for output codes $C_B$ corresponding to input codes $C_A$. Further, decision codes 718, slope, and offsets 720 are pre-calculated to enhance performance.

The slope of the delta code curve 714 incorporates the slope contributions of each of the thermometric arms 102 and MSB binary arms 116a. As can be seen from Equations 13, 16, 17, 20, and 21, a unit change (increment by one) in input code that does not reach a decision code 718 will result in the following change in output code, referred to herein as Slope_Factor:

$$\text{Slope\_Factor} = \frac{1}{1 + \text{Slope}_{ErrTherm}} \times \frac{1}{1 + \text{Slope}_{MSB1}} \times \frac{1}{1 + \text{Slope}_{MSB2}} \times \ldots \times \frac{1}{1 + \text{Slope}_{MSBK}} \quad \text{Equation 36}$$

Delta code offsets 720 for thermometric arms 102 are determined case by case, using the same set of cases as for determining decision codes 718. Referring to FIG. 8, Case 1 802 is discussed with respect to Equation 26, case 2 804 is discussed with respect to Equations 27-30, and case 3 806 is discussed with respect to Equations 31 and 32. The offset 720 (Offset$_A$) at a decision code 718 is given by Equation 37, in which $C_A$ is the input code and $C_B$ is the output code (see Equation 22):

$$\text{Delta Code} = \text{Offset}_A = C_B - C_A \quad \text{Equation 37}$$

For thermometric arm 102 $T_k$, for case 1 802, the decision code 718 is given by Equation 26. Equation 38 gives the output code corresponding to this decision code 718 in light of Equation 13. Substituting Equations 26 and 38 into Equation 37 gives the Offset$_A$ for $T_k$ for case 1 802, as shown in Equation 39:

$$C_B = T_k \times 2^B - \text{Offset}(T_k) \times \text{Slope\_Factor} \quad \text{Equation 38}$$

$$\text{Offset}_A = -\text{Offset}(T_k) \times \text{Slope\_Factor} \quad \text{Equation 39}$$

For thermometric arm 102 $T_k$, for case 2 804, the decision code 718 is given by Equation 30. Equation 40 gives the output code corresponding to this decision code in light of Equation 13. Substituting Equations 30 and 40 into Equation 37, and applying the result to Equation 25, gives the Offset$_A$ for $T_k$ for case 2 804, as shown in Equation 41:

$$C_B = T_k \times 2^B + (\text{INL}_C(T_k \times 2^B - 1) - \text{INL}_C(T_k \times 2^B)) \times \text{Slope\_Factor} \quad \text{Equation 40}$$

$$\text{Offset}_A = -\text{DNL}_C(T_k \times 2^B) \times \text{Slope\_Factor} \quad \text{Equation 41}$$

For thermometric arm 102 $T_k$, for case 3 806, the decision code 718 is given by Equation 32. Equation 42 gives the output code corresponding to this decision code 718 in light of Equation 13. Substituting Equations 32 and 42 into Equation 37 gives the Offset$_A$ for $T_k$ for case 3 806, as shown in Equation 43:

$$C_B = T_k \times 2^B + (\text{INL}_C(T_k \times 2^B) - \text{INL}_C(T_k \times 2^B)) \times \text{Slope\_Factor} \quad \text{Equation 42}$$

$$\text{Offset}_A = 0 \quad \text{Equation 43}$$

For the MSB binary arm 126, the decision code 718 is given by Equation 34. Equation 44 gives the output code corresponding to this decision code 718 in light of Equations 16 and 17. Substituting Equations 34 and 44 into Equation 37 gives the Offset$_A$ for MSB binary arm 126, as shown in Equation 45:

$$C_B = T_k \times 2^{B-1} \times 2^{B-1} + \text{Offset}_{MSB} \times (1 + \text{Slope}_{ErrTherm}) \times \text{Slope\_Factor} \quad \text{Equation 44}$$

$$\text{Offset}_A = \text{Offset}_{MSB} \times (1 + \text{Slope}_{ErrTherm}) \times \text{Slope\_Factor} \quad \text{Equation 45}$$

For a significant bit MSB binary arm 116a numbered i, where i ranges from 1 to K (recall that there are K MSB binary arms 116a) and the first MSB arm 116a (i=1) is the MSB arm 126, Equation 35 gives the decision code 718 (which is duplicative of Equation 34 for the MSB arm 126). Equation 46 gives the output code corresponding to this decision code 718 in light of Equations 20 and 21. Substituting Equations 35 and 46 into Equation 37 gives the Offset$_A$ for MSB binary arm 116a numbered i, as shown in Equation 47:

$$C_B = T_k \times 2^B + B_{MSB1} \times 2^{B-1} + B_{MSB2} \times 2^{B-2} + \ldots + 1 \times 2^{B-1-i} + \text{Offset}_{MSBi} \times (1 + \text{Slope}_{ErrTherm}) \times (1 + \text{Slope}_{ErrMSB1}) \times \ldots \times (1 + \text{Slope}_{ErrMSB(i-1)}) \times \text{Slope\_Factor} \quad \text{Equation 46}$$

$$\text{Offset}_A = \text{Offset}_{MSBi} \times (1 + \text{Slope}_{ErrTherm}) \times (1 + \text{Slope}_{ErrMSB1}) \times \ldots \times (1 + \text{Slope}_{ErrMSB(i-1)}) \times \text{Slope\_Factor} \quad \text{Equation 47}$$

In Equations 46 and 47, the Slope$_{ErrMSB1}$ term is included only for i>1. With delta code decision codes 718 and corresponding offsets 720, and the slope of the delta code curve 714, the delta code curve 714 is fully specified and can be pre-computed to accelerate output code determination at execution time. Accordingly, input codes $C_A$ can be mapped to the delta code curve 714 as given by Equation 48, where Delta Code($C_A$) is the delta code at $C_A$, Decision Code($C_A$) is the nearest decision code 718 prior to the input code $C_A$, and Offset$_A$(Decision Code($C_A$)) is the Offset$_A$ at Decision Code($C_A$):

$$\text{Delta Code}(C_A) = \text{Offset}_A(\text{Decision Code}(C_A)) + (C_A - \text{Decision Code}(C_A)) \times \text{Slope\_Factor} \quad \text{Equation 48}$$

Determining Delta Code During Serial Receipt of Input Code

In some examples, the input code $C_A$ is transmitted to the R2R DAC 100 serially, so that one bit is received per cycle, from most significant bits (corresponding to the thermometric arms 102) to least significant bits (corresponding to LSB binary arms 116b). As described above, some decision codes 718 are not located at the same input codes as corresponding major code transitions. Accordingly, a search strategy is used to quickly locate the nearest decision code 718 prior to (preceding code-wise) the input code $C_A$, so that the resulting delta code—and output code $C_B$—can be efficiently determined according to Equations 48 and 22. In some examples, the search strategy described below enables output code to be determined from a serially received input code as early as the clock cycle during which the last bit of the input code $C_A$ is received.

Figure 9A:
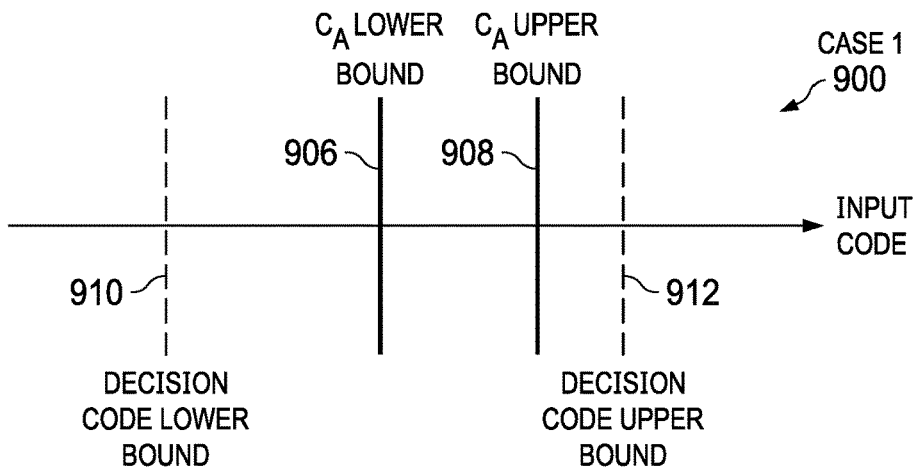
FIG. 9A shows a graph of a first case of an example relationship between a partially-received input code and nearby decision codes, for the R2R DAC of FIG. 1.
Figure 9B:
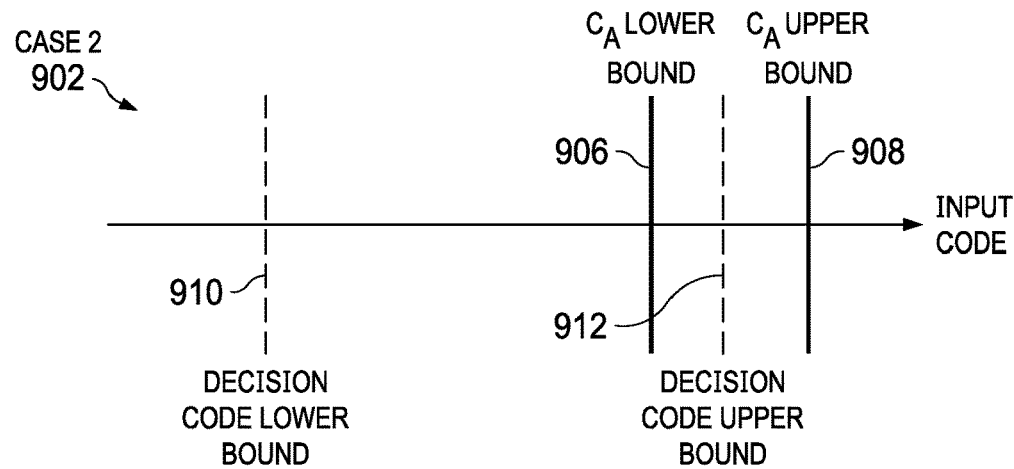
FIG. 9B shows a graph of a second case of an example relationship between a partially-received input code and nearby decision codes, for the R2R DAC of FIG. 1.
Figure 9C:
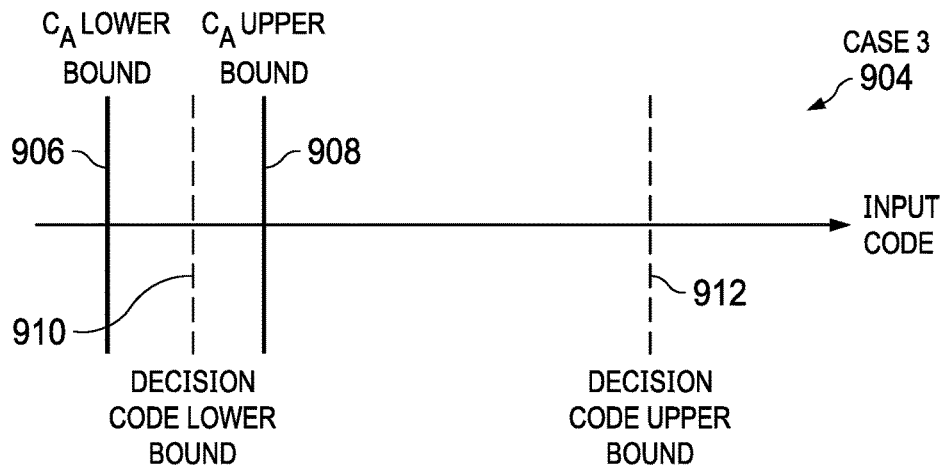
FIG. 9C shows a graph of a third case of an example relationship between a partially-received input code and nearby decision codes, for the R2R DAC of FIG. 1.

FIGS. 9A, 9B, and 9C show different cases for a search strategy to locate an input code within an individual delta code line segment 716 during serial receipt of input code bits. Accordingly, the search strategy determines which decision code 718 is the nearest decision code 718 prior to (preceding code-wise) the input code. In some examples, an input code is received at a rate of one bit per cycle of the clock 136 of the R2R DAC 100.

FIG. 9A shows a graph of a first case 900 of an example relationship between a partially-received input code and nearby decision codes, for the R2R DAC 100 of FIG. 1. FIG. 9B shows a graph of a second case 902 of an example relationship between a partially-received input code and nearby decision codes, for the R2R DAC 100 of FIG. 1. FIG. 9C shows a graph of a third case 904 of an example relationship between a partially-received input code and nearby decision codes, for the R2R DAC 100 of FIG. 1. FIGS. 9A, 9B, and 9C show a $C_A$ lower bound 906, and $C_A$ upper bound 908, a decision code lower bound 910, and a decision code upper bound 912. These are further described below.

As input code bits are received, a $C_A$ lower bound 906 and a $C_A$ upper bound 908 can be determined for the full input code from the received bits. For example, for an example four bit input code (0000 to 1111) of which two bits 11 have been received, the $C_A$ lower bound 906 would be 1100 (12 in base ten), and the $C_A$ upper bound 908 would be 1111 (15 in base ten). Accordingly, for example, after the first T+1 bits have been received, corresponding to the thermometric arms 102 and the MSB binary arm 126, the difference between the $C_A$ lower bound 906 and the $C_A$ upper bound 908 will be $2^{B-1}-1$. This is because B-1 bits remain unknown (the maximum value that can be expressed with B-1 bits is $2^{B-1}-1$). Further, after a portion of the input code corresponding to an $i^{th}$ MSB binary arm 116a has been received, the difference between the $C_A$ lower bound 906 and the $C_A$ upper bound 908 will be $2^{B-i-1}-1$.

When T+1 bits have been received, a portion of the decision code 718 corresponding to the thermometric arms 102 can be narrowed down to one or two possibilities. At this point, the difference between the $C_A$ lower bound 906 and the $C_A$ upper bound 908 will be $2^{B-1}-1$. Each $i^{th}$ subsequent bit enables a portion of the decision code 718 corresponding to the $(i+1)^{th}$ MSB binary arm 116a (MSB$_i$) to be narrowed down to one or two possibilities. At this point, the difference between the $C_A$ lower bound 906 and the $C_A$ upper bound 908 will be $2^{B-i-1}-1$. Deviations from these ideal separations are caused by INL (offset) and slope errors of the R2R DAC 100 (described with respect to Equations 4 through 11). These deviations can be restricted to much (orders of magnitude) less than $2^{B-L-1}$ through process control and design. In some examples, if DNL error for an arm is greater than or equal to half its weight, the decision code 718 search described herein can fail because some decision codes 718 may be separated by less than the $C_A$ lower bound 906 and the $C_A$ upper bound 908.

In each of the first case 900, the second case 902, and the third case 904, a determination is being made for a thermometric arms 102 portion of the decision code 718 or for a portion of the decision code 718 corresponding to an $i^{th}$ MSB binary arm 116a. The portion of the decision code 718 being determined is referred to as a decision code 718 portion of order X (lower order decision code bits equal zero).

Referring to FIG. 9A, in the first case 900, the $C_A$ lower bound 906 and the $C_A$ upper bound 908 are between a decision code lower bound 910 and a decision code upper bound 912 that are adjacent when considering only decision code 718 portions of order X and higher. For example, decision codes 718 corresponding to thermometric arms 102 $T_k$ and $T_{k+1}$, or decision codes 718 corresponding to the MSB binary arm 126 $T_k \times 2^B + 0 \times 2^{B-1}$ and $T_k \times 2^B + 1 \times 2^{B-1}$. In this case, if i<K, for a determination with respect to the next received bit of the input code, the decision code lower bound 910 will be retained as a decision code lower bound 910, and the decision code upper bound 912 will be replaced by a decision code upper bound 912 that is adjacent to the decision code lower bound 910 when considering only decision code 718 portions of order X−1 and higher. (Recall that K is the number of MSB binary arms 116a, which is also the number of binary arms 116 to be trimmed.) If i=K, then the decision code lower bound 910 is selected as the decision code 718 for determining the output code $C_B$.

Referring to FIG. 9B, in the second case 902, the $C_A$ lower bound 906 and the $C_A$ upper bound 908 surround a decision code upper bound 912 of order X. In this case, one or more additional input code bits is needed to determine whether the decision code 718 portion of order X should correspond to the decision code lower bound 910 or the decision code upper bound 912. Accordingly, both options are retained, and a determination regarding the decision code 718 portion of order X is made when both the $C_A$ lower bound 906 and the $C_A$ upper bound 908 are either less than or greater to the decision code upper bound 912 of order X. In the former case (less than), the decision code lower bound 910 of order X is selected. For a binary arm 116, this corresponds to the bit of order X equaling zero. In the latter case (greater than), the decision code upper bound 912 of order X is selected. (For a binary arm 116, this corresponds to the bit of order X equaling one. Repeated iterations of the second case 902 can result in a decision code being determined as late as after receipt of the last bit of the input code.

Referring to FIG. 9C, in the third case 904, the $C_A$ lower bound 906 and the $C_A$ upper bound 908 surround thermometric arm 102 decision code lower bound 910, corresponding to a thermometric arm $T_k$. (The third case 904 cannot apply to binary arms 116 because binary arm 116 code values are zero or one, while thermometric arm 102 code values are incremental from zero through $2^{T-1}$.) In this case, one or more additional input code bits is needed to determine whether the thermometric arm 102 decision code 718 portion should equal $T_k$ (the full input code is greater than the decision code lower bound 910) or $T_{k-1}$ (the full input code is less than the decision code lower bound 910).

As described above, once the decision code 718 is determined and the input code is fully received, the delta code can be found using Equation 48, and the output code can be found using Equation 22.

Modifications are possible in the described embodiments, and other embodiments are possible, within the scope of the claims.

In some examples, the R2R DAC can correct for INL without requiring additional analog circuit overhead. In some examples, the R2R DAC enables reduction of design complexity of very high precision DACs, such as DACs where N equals eighteen or more.

In some examples, the R2R DAC avoids use of additional trim DACs.

In some examples, the R2R DAC avoids use of voltage head-room or foot-room.

In some examples, the R2R DAC is used in shared DAC controllers in multi-channel implementations.

In some examples, the R2R DAC is used in unbuffered high throughput DACs.

In some examples, the R2R DAC is used with auto-calibration algorithms that can be used to calibrate out shifts in linearity due to stress induced artifacts.

In some examples, the methods and structures described herein can be used in DAC types other than R2R ladder network DACs, such as R-string DACs and current DACs (IDACs).

In some examples, the controller is designed to work on the input code once the input code has been fully received. In some such examples, different forms of clock input are used.

In some examples, a DAC uses multiple clocks. Clocks used by a DAC can include, for example, a communications clock corresponding to a data reception rate (a rate at which input code bits are received) and an internal clock corresponding to a calculation rate of components of an IC that includes the DAC.

In some examples, methods other than those discussed herein can be used to deliberately induce negative DNL errors at major code transitions.

In some examples, ΔR values other than those discussed herein can be used.

In some examples, different values of ΔR are applied to modify different MSB connector resistors.

In some examples, a DAC has no thermometric arms, only binary arms. In some examples, a DAC has no binary arms, only thermometric arms.

In some examples, an end of a connector resistor nearest to the output node is referred to as the output end of the connector resistor, and an end of a connector resistor nearest to the termination arm is referred to as the terminus end of the connector resistor.

In some examples, a high voltage reference having a (relatively) high reference voltage and a low voltage reference having a (relatively) low reference voltage (such as VDD+ and VDD−, or VDD and ground, respectively) are used. Accordingly, a ground can also be referred to as a low voltage reference. In some examples, switches couple to a low voltage reference when deactivated (in response to a binary zero in an input code) and to a high voltage reference when activated (in response to a binary one in an input code). In some examples, switches couple to a low voltage reference when activated (in response to a binary one in an input code) and to a high voltage reference when deactivated (in response to a binary zero in an input code).

In some examples, a test tool provides input codes to a DAC controller to generate output voltages to facilitate determining DNL errors, and the test tool determines DNL errors (for example, in code increment or voltage units), including by measuring DNL errors. The test tool and/or the DAC controller controls storage of the DNL errors in a memory of the IC that includes the DAC. In some examples, the DAC controller measures DNL errors.

The term "couple" may include connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board. Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A digital to analog converter (DAC), comprising:
an output terminal;
multiple most significant bit (MSB) connector resistors each having a first resistance and each including a first MSB connector terminal and a second MSB connector terminal;
multiple least significant bit (LSB) connector resistors each having a second resistance different than the first resistance, and each of the multiple LSB connector resistors including a first LSB connector terminal and a second LSB connector terminal; and
multiple binary arm resistors each having a third resistance different than the first resistance and the second resistance, each of the multiple binary arm resistors including a first binary terminal and a second binary terminal;
a memory; and
a controller configured to:
receive an input code;
control the DAC to generate an output voltage using the input code;
facilitate determining differential nonlinearity (DNL) error contributions corresponding to each of the binary arm resistors coupled to ones of the second MSB connector terminals; and
store the determined DNL error contributions in the memory;
wherein the MSB connector resistors are coupled in series and the LSB connector resistors are coupled in series, so that a first one of the first MSB connector terminals is coupled to the output terminal, a last one of the second MSB connector terminals is coupled to a first one of the first LSB connector terminals.

2. The DAC of claim 1, wherein the first resistance is R−ΔR, the second resistance is R, and the third resistance is 2R.

3. The DAC of claim 1, further including multiple thermometric arm resistors each having the third resistance and each including a first thermometric terminal and a second thermometric terminal, the first thermometric terminals coupled to the output terminal.

4. The DAC of claim 3, further including:
a first reference voltage terminal adapted to receive a first reference voltage;
a second reference voltage terminal adapted to receive a second reference voltage;
multiple arm switches, different ones of the arm switches coupled to different corresponding ones of the second binary terminals to couple the corresponding second binary terminal to the first reference voltage terminal when the corresponding arm switch is activated, and to couple the corresponding second binary terminal to the second reference voltage terminal when the corresponding arm switch is deactivated; and
a controller configured to receive an input code representing a first output voltage of the R2R DAC, to generate an output code that representing a second output voltage of the R2R DAC different from the first output voltage, and to control the arm switches using the output code.

5. The DAC of claim 4, wherein a difference between the first resistance and the second resistance is selected to cause activations of ones of the switches coupled via corresponding binary arm resistors to second MSB connector terminals to contribute negative differential nonlinearity (DNL) errors to an output voltage of the DAC.

6. The DAC of claim 1, further including:
a clock configured to generate a clock signal.
7. The DAC of claim 1, wherein a difference between the first resistance and the second resistance is different for different ones of the MSB binary connector resistors.
8. The DAC of claim 1, further including:
a reference voltage terminal;
multiple trim connector resistors having the second resistance and including a first trim connector terminal and a second trim connector terminal; and
multiple trim arm resistors having the third resistance and including a first trim arm terminal and a second trim arm terminal;
wherein the trim connector resistors are coupled in series between the last LSB connector resistor and the reference voltage terminal; and
wherein the first trim arm terminal of different ones of the trim arm resistors is coupled to the second trim connector terminal of different ones of the trim connector resistors.
9. A digital-to-analog converter (DAC) comprising:
a first reference voltage terminal adapted to receive a first reference voltage;
a second reference voltage terminal adapted to receive a second reference voltage;
an output node;
multiple switches;
multiple first resistors including an output end and a terminus end and having a first resistance;
multiple second resistors including an output end and a terminus end and having a second resistance less than the first resistance;
multiple third resistors having a third resistance greater than the first resistance;
multiple most significant bit (MSB) arms, each of the MSB arms including one of the third resistors and coupled to the terminus end of a different one of the second resistors; and
multiple least significant bit (LSB) arms, each of the LSB arms including one of the third resistors and coupled to the terminus end of a different one of the first resistors;
wherein the first resistors are coupled in a first series and the second resistors are coupled in a second series, so that an output end of a second resistor at a first end of the first series is coupled to the output terminal and a terminus end of a second resistor at a second end of the first series is coupled to an output end of a first resistor at a first end of the second series;
further including a controller that includes a code input adapted to receive a control code, the controller configured to activate and deactivate the switches in response to the control code, the control code corresponding to a first output voltage of the DAC, the controller configured to generate an output code that corresponds to a second output voltage of the R2R DAC different from the first output voltage, and to control the switches using the output code.

10. The DAC of claim 9, wherein the first resistance is R, the second resistance is R−ΔR, and the third resistance is 2R.
11. The DAC of claim 9, wherein a magnitude of the output voltage is responsive to a bit-significance of ones of the LSB arms or MSB arms corresponding to activated ones of the switches.
12. The DAC of claim 9, further including multiple thermometric arm resistors each having the third resistance and each coupled to the output node.
13. The DAC of claim 9, wherein a difference between the first resistance and the second resistance is selected to cause activations of ones of the switches coupled via corresponding ones of the third resistors to the terminus end of a corresponding one of the second resistors to contribute negative differential nonlinearity (DNL) errors to the output voltage.
14. The DAC of claim 9, further including:
a clock configured to generate a clock signal.
15. A digital-to-analog converter (DAC) comprising:
a first reference voltage terminal adapted to receive a first reference voltage;
a second reference voltage terminal adapted to receive a second reference voltage;
an output terminal;
multiple switches;
multiple first resistors including an output end and a terminus end and having a first resistance;
multiple second resistors including an output end and a terminus end and having a second resistance less than the first resistance;
multiple third resistors having a third resistance greater than the first resistance;
multiple most significant bit (MSB) arms, each of the MSB arms including one of the third resistors and coupled to the terminus end of a different one of the second resistors; and
multiple least significant bit (LSB) arms, each of the LSB arms including one of the third resistors and coupled to the terminus end of a different one of the first resistors;
wherein the first resistors are coupled in a first series and the second resistors are coupled in a second series, so that an output end of a second resistor at a first end of the first series is coupled to the output terminal and a terminus end of a second resistor at a second end of the first series is coupled to an output end of a first resistor at a first end of the second series;
further including:
a clock configured to generate a clock signal; and a controller that includes a code input adapted to receive a control code, the controller configured to activate and deactivate the switches; in response to the control code, the control code corresponding to a first output voltage of the DAC, the controller configured to generate an output code that corresponds to a second output voltage of the R2R DAC different from the first output voltage, and to control the switches using the output code.

* * * * *